(12) United States Patent  (10) Patent No.: US 8,179,164 B2
Suzuki                    (45) Date of Patent:    May 15, 2012

(54) PULSE SIGNAL GENERATING DEVICE, TRANSPORT DEVICE, IMAGE FORMING APPARATUS, AND PULSE GENERATING METHOD

(75) Inventor: Toshiyuki Suzuki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 548 days.

(21) Appl. No.: 12/416,230

(22) Filed: Apr. 1, 2009

(65) Prior Publication Data

US 2009/0256613 A1   Oct. 15, 2009

(30) Foreign Application Priority Data

Apr. 9, 2008 (JP) ................................. 2008-101259

(51) Int. Cl.
*H03K 5/19* (2006.01)

(52) U.S. Cl. .......................................... 327/18; 327/19

(58) Field of Classification Search ................ 327/18–20
See application file for complete search history.

(56) References Cited

U.S. PATENT DOCUMENTS

| 5,969,558 | A  | * | 10/1999 | Abe ............................. 327/292 |
| 6,545,508 | B2 | * | 4/2003  | Senba ............................ 327/20 |
| 7,046,048 | B2 | * | 5/2006  | Starr et al. ...................... 327/99 |
| 7,321,244 | B2 | * | 1/2008  | Kobayashi ....................... 327/99 |

FOREIGN PATENT DOCUMENTS

| JP | 11-245383   | 9/1999 |
| JP | 2003-280484 | 10/2003 |
| JP | 2004-021236 | 1/2004 |
| JP | 2005-350195 | 12/2005 |

* cited by examiner

*Primary Examiner* — Hai L Nguyen
(74) *Attorney, Agent, or Firm* — Workman Nydegger

(57) ABSTRACT

A pulse signal generating device includes: an encoder that outputs a pulse with a period corresponding to the speed of an object to be detected; a measurement unit that measures a period of the pulse; a storage unit that stores the measured period; an operation unit that calculates a reasonable period, which is estimated to be statistically reasonable, on the basis of a result of period measurement of a plurality of pulses; a detection unit that detects period abnormalities when the measured period of the measurement unit satisfies a period abnormality condition specified from the reasonable period; and a pulse generating unit that generates a pulse on the basis of the measured period when the period abnormalities are not detected and generates a pulse on the basis of the reasonable period when the period abnormalities are detected.

8 Claims, 11 Drawing Sheets

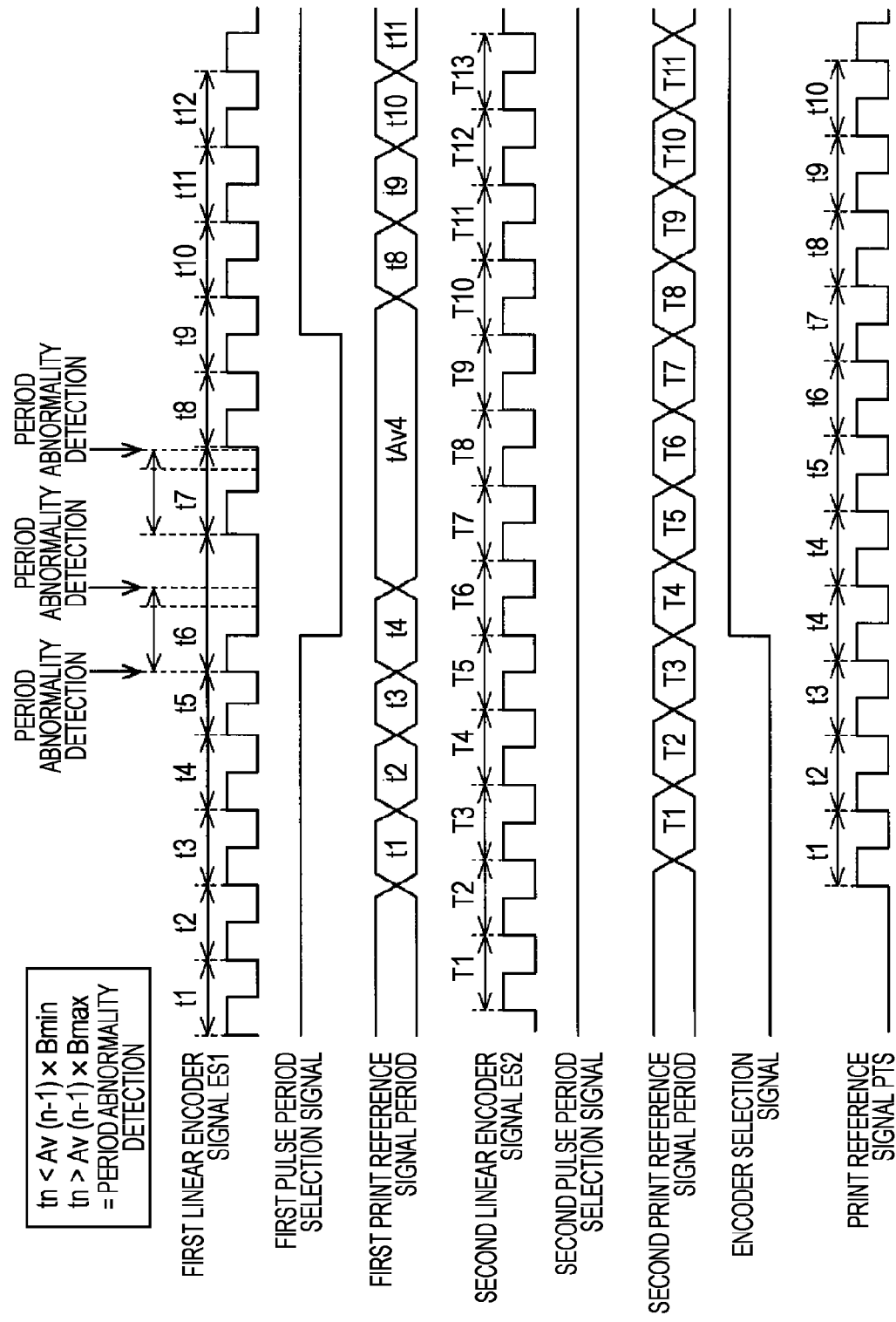

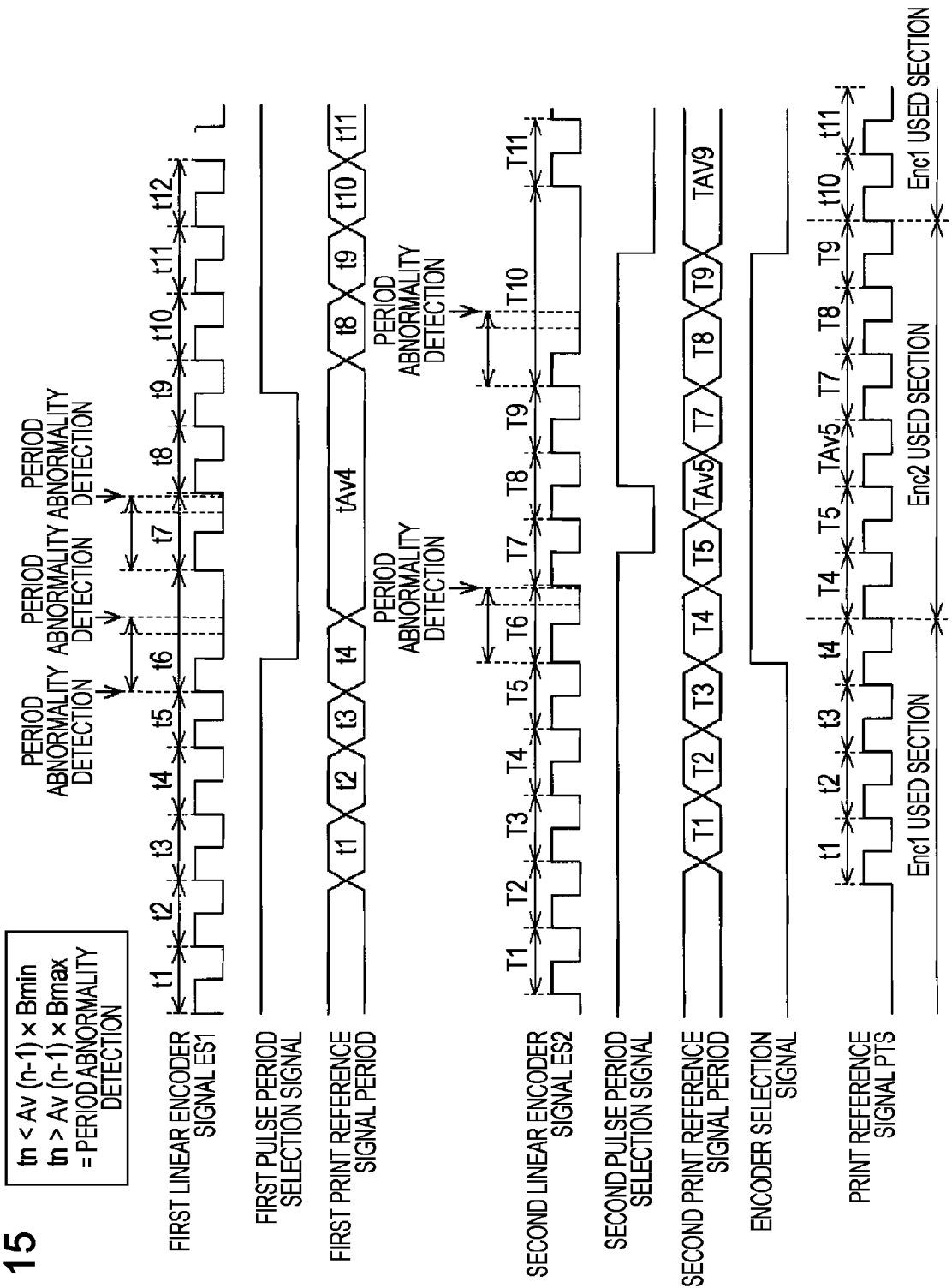

PULSE SIGNAL GENERATING DEVICE, TRANSPORT DEVICE, IMAGE FORMING APPARATUS, AND PULSE GENERATING METHOD

BACKGROUND

1. Technical Field

The present invention relates to a pulse signal generating device that generates a pulse with a restored period by detecting period abnormalities in an output pulse of an encoder, a transport device, an image forming apparatus, and a pulse signal generating method.

2. Related Art

A known image forming apparatus, such as a printer, has a configuration in which a recording head performs printing on paper (target) transported in a transport direction. In this case, it is necessary to discharge ink droplets at proper timing according to the paper transport position. For this reason, a print reference signal is generated in synchronization with the transport speed of paper on the basis of an output signal (pulse signal), which is output from an encoder in synchronization with the paper transport speed, and the discharge timing is controlled on the basis of the print reference signal.

For example, JP-A-11-245383 discloses a printer (image forming apparatus) that uses a transport belt as a paper transport unit. A mark for detecting the speed and position is set on the transport belt, and a character or an image is printed on the paper by reading the mark with an encoder and discharging ink on the basis of the encoder signal.

As disclosed in JP-A-11-245383, in a printer using a paper transport unit such as a transport belt, ink droplets are discharged for every desired pitch by detecting the amount of movement of recording paper from the amount of movement of a belt in a condition where the amount of movement of recording paper is assumed to be equal to the amount of movement of the belt. Since discharge of ink droplets is performed in synchronization with an encoder signal having a pulse with the same distance as a print pitch, high-quality printing capable of suppressing the positional deviation of landing ink droplets becomes possible even if there is a speed variation in the transport unit. However, since encoder signals need to be output continuously at the same pitch in the method disclosed in JP-A-11-245383, the following problems occur.

If the circumferential length of the recording paper transport unit (transport belt) is not integral multiples of the print pitch, a discontinuous portion occurs in an output signal of a linear encoder, which causes image deterioration. Moreover, when ink mist or paper particles adhere to the linear encoder disposed on the transport belt or the linear encoder is damaged, lack of a pulse occurs in the encoder signal. Also in this case, image deterioration occurs.

A device for solving such a problem is disclosed in JP-A-2003-280484 (for example, paragraphs [0023] to [0061] in the specification and FIGS. 1 and 9 to 22) and JP-A-2005-350195 (for example, paragraphs [0041] to [0053] in the specification and FIGS. 6 to 11), for example.

The printer disclosed in JP-A-2003-280484 has a configuration where the motor speed control is performed by a PLL using a linear encoder, a unit that detects a discontinuous portion of a linear encoder is provided, and a speed and position control unit is changed on the basis of the detection result of the discontinuity detection unit. In a discontinuous portion, an output interval average value of an output signal measured in a continuous portion is used. Moreover, a control method in case of using two sensors is described as measures against a case where a discontinuous portion is long, such that it is prevented that the belt speed cannot be detected for a long period of time.

JP-A-2005-350195 discloses a configuration where two sensors for detecting a mark are provided such that positions of objects to be detected are different and an output signal, which is used for motor control for controlling the transport speed of a belt constantly, is switched to an output signal of the other sensor when a discontinuous portion of a mark, such as a joint of the transport belt, or lack of a pulse caused by dust or damage is detected on the basis of an output signal of one sensor. Moreover, in order to suppress the phase difference between signals at the time of sensor switching, a configuration where an interpolation processing portion generates a high-resolution signal by dividing a measured period or using the same clock so that a signal error (phase difference) is reduced is adopted. Moreover, JP-A-2003-280484 and JP-A-2005-350195 disclose a method of counting a period of a sensor signal (encoder signal) with a base clock and determining that there is a discontinuous portion (lack of a pulse of an encoder signal) of a mark when the pulse period of the sensor signal reaches a fixed threshold value or more.

Furthermore, JP-A-2004-21236 discloses a method of performing a motor speed control using a linear encoder provided on a belt. According to this method, a unit that detects the moving speed of an encoder mark, calculates and acquires the control amount of a belt that reaches the target speed set beforehand on the basis of the moving speed, and controls the speed of the belt with the control amount before the next encoder mark appears is provided. When an encoder mark is not clear due to a dirt or damage, operation and acquisition of the control amount are not performed, and the control amount at a previous mark is held and the speed control is performed using the held control amount.

In addition, a positional deviation control device that detects an error, such as unclearness, of an encoder mark is described in JP-A-2004-21236. The positional deviation control device performs error detection using the following conditional expression (a).

$$0.99 \times To \leq t \leq 1.01 \times To \qquad (a)$$

(where, t: detection signal period, To: reference detection time To=Do/Vo, Do: gap between encoder marks, Vo: reference moving speed)

However, in the technique disclosed in JP-A-2003-280484, a method of improving the printing accuracy by performing the motor speed control such that the speed of the transport belt is constant is adopted. Accordingly, there was a possibility that a controller for motor control would be complicated and the control would not be constant. Furthermore, in the technique disclosed in JP-A-2005-350195, a method of improving the printing accuracy by performing the motor speed control such that the speed of the transport belt is constant is adopted. Accordingly, there are problems that the control is variable and the device needs to adjust a control gain and the like, for example.

Moreover, the conditional expression (a) disclosed in JP-A-2004-21236 is an effective means only in case of performing the speed control. In case of performing printing in synchronization with an encoder signal as disclosed JP-A-11-245383, the reference detection time To (threshold value for period error detection) becomes a fixed value. In this case, according to the individual difference of the device, a speed distribution central value of a belt changes. Accordingly, in devices shifted up and down with respect to a speed distribution central value where the speed distribution central value is set, there was a problem that even in the case of a normal signal, the detection signal period t exceeds a threshold value of a lower limit (=0.99·To) or upper limit (=1.01·To) and the normal signal is detected as an error. In order to prevent such a problem, a method of calculating the speed central value for every apparatus at the time of shipment may be considered. In this case, however, there are disadvantages that it is not possible to cope with an increase in cost or a temporal change.

SUMMARY

An advantage of some aspects of the invention is that it provides a pulse signal generating device that can reduce the situation where period abnormalities are detected due to an individual difference of the device even though a period is normal and that can generate a pulse with a reasonable period when the period abnormalities occur, a transport device, an image forming apparatus, and a pulse signal generating method.

According to an aspect of the invention, a pulse signal generating device includes: an encoder that outputs a pulse with a period corresponding to the speed of an object to be detected; a measurement unit that measures a period of the pulse; a storage unit that stores the measured period; an operation unit that calculates a reasonable period, which is estimated to be statistically reasonable, on the basis of a result of period measurement of a plurality of pulses; a detection unit that detects period abnormalities when the measured period of the measurement unit satisfies a period abnormality condition specified from the reasonable period; and a pulse generating unit that generates a pulse on the basis of the measured period when the period abnormalities are not detected and generates a pulse on the basis of the reasonable period when the period abnormalities are detected.

According to the aspect of the invention, the measurement unit measures a period of a pulse output from the encoder, and the measured period is stored in the storage unit. The operation unit calculates a reasonable period, which is estimated to be statistically reasonable, on the basis of a result of period measurement of a plurality of pulses. In addition, the detection unit detects the period abnormalities when the measured period of the measurement unit satisfies the period abnormality condition specified from the reasonable period. When the period abnormalities are not detected, the pulse generating unit generates a pulse on the basis of the measured period stored in the storage unit. On the other hand, when the period abnormalities are detected, the pulse generating unit generates a pulse on the basis of the reasonable period. In this case, since pulses are generated such that the pulses are connected by outputting pulses for every measured period, problems, such as a problem that a period of an output signal becomes short or long abruptly, do not occur even if the reference position of a period is switched.

Here, since the period abnormality condition used when the detection unit detects the period abnormalities is specified as a unique condition for every device, from the reasonable period statistically derived from measured periods of a plurality of pulses. As a result, the situation where the period abnormalities are detected in spite of a normal pulse period corresponding to the device, which could happen in a case where a common period abnormality condition is set in devices, can be avoided. Therefore, the situation where the period abnormalities are detected due to the individual difference of the device even though the period is normal can be reduced, and a pulse with an appropriate period can be generated when the period abnormalities actually occur in the device.

In the pulse signal generating device according to the aspect of the invention, the detection unit preferably includes a pulse missing detection unit that detects pulse missing as the period abnormalities when the measured period exceeds a pulse missing threshold value.

According to the aspect of the invention, when pulse missing (pulse lack) of an encoder occurs, it is detected as pulse missing because a measured period exceeds a pulse missing threshold value. Since the pulse generating unit generates a pulse with a reasonable period even at the time of pulse missing, a pulse signal without pulse missing can be output.

Furthermore, in the pulse signal generating device according to the aspect of the invention, the operation unit preferably includes an abnormal period excluding unit that does not use the measured period detected as the period abnormalities for calculation of the reasonable period.

According to the aspect of the invention, since the measured period detected as period abnormalities is excluded by the abnormal period excluding unit, the measured period detected as period abnormalities is not used for calculation of a reasonable period. As a result, since a reliable reasonable period is secured and high detection precision of period abnormalities is secured, a pulse can be generated with an appropriate period when the period abnormalities occur.

Furthermore, in the pulse signal generating device according to the aspect of the invention, preferably, the operation unit calculates a current reasonable period using a predetermined number (less than Q) of data, which includes three data items of a previous reasonable period, a current measured period, and the number of data Q, and performs an operation using an operation expression equivalent to a statistical calculation expression for calculating the current reasonable period on the basis of a measured period for Q pulses. In addition, the 'current measured period' does not necessarily indicate a latest measurement result of the measurement unit, but indicates a measured period used to calculate a current reasonable period. Accordingly, the 'current measured period' may be a previous measurement result of the measurement unit or a measurement result before last of the measurement unit.

According to the aspect of the invention, a reasonable period that is equal to being calculated from a measured period of three or more pulses is calculated using two data items of the previous reasonable period and the current measured period. Accordingly, since the amount of data that should be held (stored) in order to calculate the current reasonable period (memory) is reduced, for example, the capacity of a memory (including a RAM, a nonvolatile memory, and a register) can be saved.

Furthermore, in the pulse signal generating device according to the aspect of the invention, preferably, the encoder includes a scale portion, which is provided along a movement direction of the object to be detected, and a plurality of sensors that detect different positions of the scale portion and output pulses each having a period corresponding to the speed. The detection unit is preferably provided in a plural number corresponding to the sensors so that the period abnormalities are detected for each of the sensors. The pulse generating unit preferably includes a switching unit that when period abnormalities are detected in a sensor that adopts a measured period, switches the sensor that adopts the measured period to another sensor in which the period abnormalities are not detected. The pulse generating unit preferably generates a pulse on the basis of the reasonable period when the detection unit detects the period abnormalities in all of the plurality of sensors.

According to the aspect of the invention, when the period abnormalities are detected in a sensor that adopts the measured period, the pulse generating unit switches the sensor that adopts the measured period to another sensor in which the period abnormalities are not detected by means of the switching unit. In addition, when the detection unit detects the period abnormalities in all of the plurality of sensors, a pulse based on the reasonable period is generated for the first time. Accordingly, since a frequency of pulse generation based on a reasonable period at the time of detection of period abnormalities is reduced, an accurate pulse based on the measured period of a sensor can be generated if possible. As a result, a more reliable pulse signal generating device can be provided.

According to another aspect of the invention, a transport device includes the pulse signal generating device described above; and a transport unit as the object to be detected. The encoder included in the pulse signal generating device outputs a pulse with a period corresponding to the transport speed of the transport unit.

According to the aspect of the invention, it is possible to provide a transport device capable of generating a pulse, which has a period corresponding to the transport speed of the transport unit, in a state where there are almost no period abnormalities.

Furthermore, according to still another aspect of the invention, an image forming apparatus includes: the transport device described above; a recording unit that performs recording on a target transported by the transport unit to thereby form an image; and a recording pulse generating unit that generates a recording timing pulse of the recording unit on the basis of a pulse generated by the pulse generating unit.

According to the aspect of the invention, since a recording timing pulse is generated on the basis of a pulse with an accurate period corresponding to the transport speed of the transport unit by the recording pulse generating unit, an image can be precisely recorded on the target transported by the transport unit.

Furthermore, according to still another aspect of the invention, a pulse signal generating method includes: measuring a period of a pulse output from an encoder; storing the measured period; calculating a reasonable period on the basis of a result of period measurement of a plurality of pulses; detecting period abnormalities when the measured period in the measuring satisfies a period abnormality condition specified from the reasonable period; and generating a pulse on the basis of the measured period when the period abnormalities are not detected and generating a pulse on the basis of the reasonable period when the period abnormalities are detected. According to the aspect of the invention, the same effects as in the pulse signal generating device can be obtained.

BRIEF DESCRIPTION OF THE DRAWINGS

The invention will be described with reference to the accompanying drawings, wherein like numbers reference like elements.

FIG. 14 is a timing chart illustrating an operation when the period abnormalities are detected.

FIG. 15 is a timing chart illustrating an operation when abnormal periods are detected in both encoders.

DESCRIPTION OF EXEMPLARY EMBODIMENTS (First Embodiment)

Hereinafter, a first embodiment of the invention will be described with reference to FIGS. 1 to 11.

Figure 1:
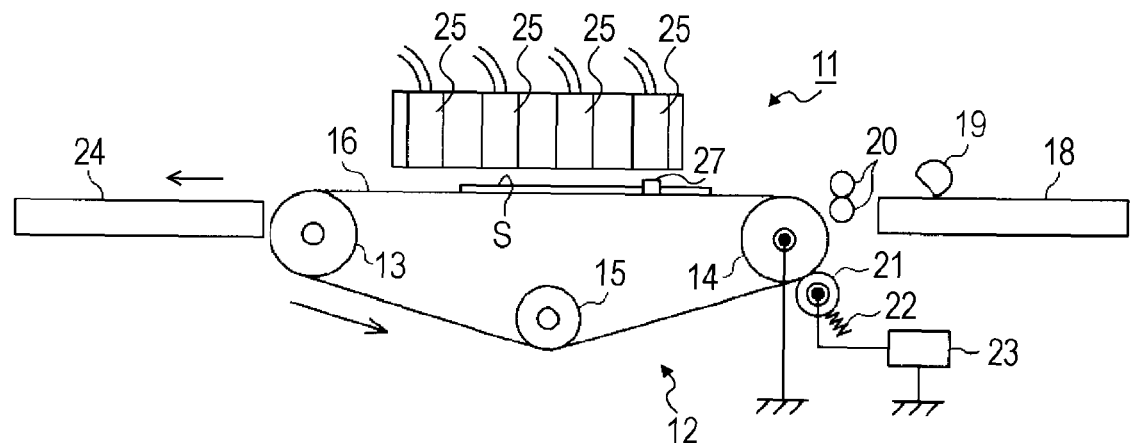
FIG. 1 is a side view schematically illustrating the configuration of a printer in a first embodiment.
Figure 2:
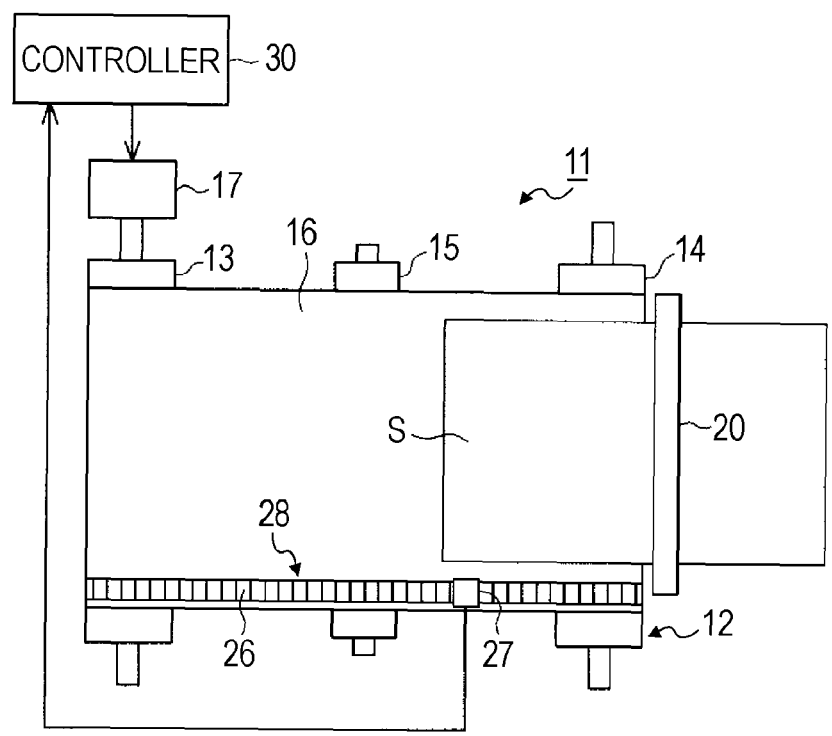
FIG. 2 is a plan view schematically illustrating the printer in a state where a recording head is omitted.

FIG. 1 is a side view schematically illustrating an ink jet recording apparatus, and FIG. 2 is a plan view schematically illustrating the ink jet recording apparatus. In addition, a recording head and the like are omitted in FIG. 2.

As shown in FIGS. 1 and 2, an ink jet recording apparatus (hereinafter, simply referred to as a printer 11) as an image forming apparatus includes a belt transport device 12 as a transport unit that transports recording paper S. The belt transport device 12 has a driving roller 13 provided at a downstream side in the paper transport direction (left side in FIGS. 1 and 2), a driven roller 14 provided at an upstream side in the paper transport direction, a tension roller 15 disposed at the approximately middle position between the driving roller 13 and the driven roller 14 and at a slightly lower side (refer to FIG. 2), and an endless transport belt 16 wound around the rollers 13 to 15.

As shown in FIG. 2, an output shaft of an electric motor 17 is connected to the driving roller 13 so that the power can be transmitted directly or through a deceleration mechanism (not shown). When the electric motor 17 is driven to normally rotate, the driving roller 13 is driven to rotate such that the transport belt 16 rotates in a direction in which the recording paper S can be transported from the upstream side to the downstream side.

A paper feed portion 18 is provided at the upstream side of the belt transport device 12, and the recording paper S loaded on the paper feed portion 18 is fed one at a time by a paper feed roller 19. A gate roller 20 is provided between the paper feed portion 18 and the belt transport device 12, and the recording paper S is fed onto the transport belt 16 by rotation of the gate roller 20. In addition, the gate roller 20 corrects the skew of the recording paper S by bringing the recording paper S into contact with a roller surface, and matches timing such that the recording paper S is placed on the target position on the transport belt 16 by determining the driving start timing of the gate roller 20 and then sends the recording paper S.

Below the driven roller 14, a charging roller 21 is disposed to be biased toward the driven roller 14 by a spring 22 so that the charging roller 21 can rotate in a state of being in contact with the transport belt 16. Since the charging roller 21 is connected to a power source 23, the charging roller 21 can make the transport belt 16 electrically charged. Then, the recording paper S electrostatically sticks to the transport belt 16. In addition, a method for sticking of the recording paper S onto the belt is not limited to the electrostatic sticking method. For example, a negative pressure sticking method of sticking the recording paper S by generating the suction air flow with the negative pressure from a suction hole formed on the transport belt 16 may be adopted. In addition, a paper discharge portion 24 as a discharge place of the recording paper S after printing on the transport belt 16 is provided at the downstream side of the belt transport device 12.

Above the middle position of the transport belt 16 in the transport direction thereof, a plurality of line-head-type long recording heads 25 are disposed along the transport direction in a direction in which the width direction of the transport belt 16 and the longitudinal direction of each of the recording heads 25 are parallel. In the recording head 25, a plurality of nozzle rows, in which a plurality of nozzles are arrayed at fixed nozzle pitches over a range slightly wider than an entire region of the recording paper S in the width direction that has a maximum width over which the printer 11 can perform printing, are provided on a bottom surface (nozzle formed surface). Accordingly, an image and the like can be printed on the recording paper S being transported by ejecting ink droplets from the nozzles sequentially at timing matched with the paper transport speed. In this example, each recording head 25 is connected with an ink cartridge (not shown) through an ink supply tube, and ink supplied from the corresponding ink cartridge is discharged. In this example, the recording heads 25 eject ink droplets corresponding to four colors of black, cyan, magenta, and yellow in order from the upstream side (right side in FIG. 1).

As shown in FIG. 2, in the side edge of the upper surface of the transport belt 16, a magnetic linear scale 26 as a scale portion is provided in the entire edge of the transport belt 16 along the transport direction. The magnetic linear scale 26 is formed by recording a magnetic pattern on a belt-like magnetic recording layer, which is formed in the side edge of the transport belt 16, at fixed pitches. A magnetic sensor 27 as a sensor for reproducing a magnetic pattern recorded on the magnetic linear scale 26 is provided in a position near the upper side (front side of the plane of the drawing in FIG. 2) of the magnetic linear scale 26. A magnetic linear encoder (hereinafter, simply referred to as a 'linear encoder 28') is formed by the magnetic linear scale 26 and the magnetic sensor 27. In addition, a controller 30 as a control unit is provided in the printer 11. The controller 30 controls driving of the electric motor 17 (shown in FIG. 2) and controls ejection of ink droplets at proper timing matched with the paper transport speed (paper transport position) based on a print reference signal PTS (ejection timing signal; refer to FIGS. 9 and 10) which is generated on the basis of an encoder signal ES input from the magnetic sensor 27 in an internal circuit.

Figure 3:
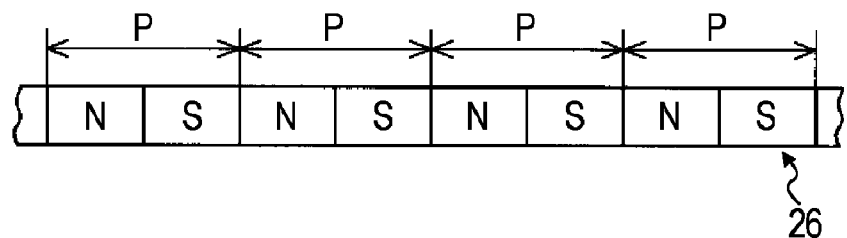
FIG. 3 is a plan view schematically illustrating a magnetic linear scale.

FIG. 3 is a schematic view illustrating a part of a magnetic pattern of a magnetic linear scale. As shown in FIG. 3, on the magnetic linear scale 26, a magnetic pattern in which N poles and S poles are alternately magnetized in a regular manner at fixed pitches (magnetic pitch P) is formed to detect the position of the transport belt 16 (the same for the recording paper S). The magnetic pitch P that is an arrangement period of detected elements (poles N and S) of the magnetic linear scale 26 is set from the belt transport speed and the print resolution at the time of printing of the printer 11. For example, the magnetic pitch P is a value of about 35 μm (in the case of resolution of 720 dpi) or 70 μm (in the case of resolution of 360 dpi).

Figure 4:
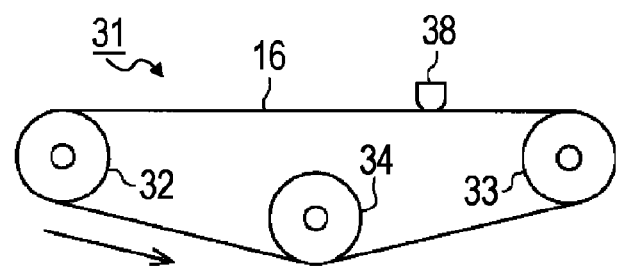
FIG. 4 is a side view schematically illustrating a magnetizer.
Figure 5:
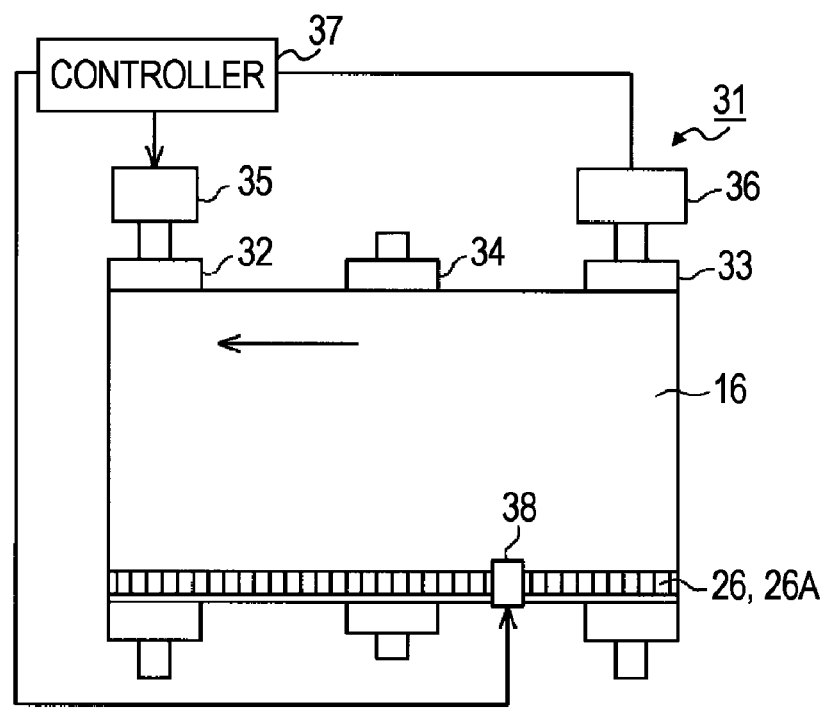
FIG. 5 is a plan view schematically illustrating the magnetizer.

FIGS. 4 and 5 are schematic views illustrating a magnetizer of a magnetic linear scale. FIG. 4 is a side view schematically illustrating the magnetizer, and FIG. 5 is a plan view schematically illustrating the magnetizer.

A magnetizer 31 includes a driving roller 32, a driven roller 33, and a tension roller 34 having almost the same configuration as those of the belt transport device 12 of the printer 11. In the transport belt 16, a magnetic layer 26A with a predetermined width is formed in the side edge not included in the paper transport path using a technique, such as coating. The transport belt 16 is mounted to be wound around the rollers 32 to 34.

As shown in FIG. 5, an electric motor 35 (for example, a DC motor) is connected to the driving roller 32 so that the power can be transmitted directly or through a deceleration mechanism. In addition, a rotary encoder 36 with high resolution (for example, 7,200,000 pulses/rev) is attached to the driven roller 33. An encoder pulse synchronized with the rotation angle from the rotary encoder 36 is input to a controller 37, and the controller 37 controls driving of the electric motor 35 such that the transport belt 16 is driven to rotate at precisely constant speed on the basis of the encoder pulse.

In the magnetizer 31, a writing magnetic head 38 shown in FIG. 4 is provided at a position of the transport belt 16 corresponding to the magnetic layer 26A in a state of being in light contact with the magnetic layer 26A. In addition, for example, a magnetic sensor that can output multiple values, such as a GMR (giant magneto resistive effect) sensor and an MR (magneto resistive effect) sensor, is used as the writing magnetic head 38. In addition, a hall device, an MI (magnetic impedance) element, and the like may also be used.

The writing magnetic head 38 is connected to a writing control circuit (not shown) within the controller 37. The writing control circuit writes a magnetic pattern, in which the poles N and S are alternately magnetized at the fixed magnetic pitch P, in the magnetic layer 26A by changing the current direction of a coil in the writing magnetic head 38 using a frequency-divided signal which is obtained, for example, by dividing an encoder pulse from the rotary encoder 36. Thus, the transport belt 16 having the magnetic linear scale 26, on which a predetermined magnetic pattern is written, at the side end is wound around the rollers 13 to 15 of the printer 11.

In addition, since the transport belt 16 is formed by bonding both ends of a sheet of belt-like rubber, which has a predetermined length, to each other, the transport belt 16 has a joint. When there are shape defects, such as a level difference, in the joint portion or paper particles or ink mist adheres to the magnetic linear scale 26, lack (pulse missing) of an output pulse of the magnetic sensor 27 that form the linear encoder 28 occurs. In addition, since a middle value (average belt speed) in the speed distribution of the transport belt 16 changes with an individual difference of the printer 11, a middle value (average pulse period) in the period distribution of pulses output from the linear encoder 28 changes for every printer 11. Moreover, variations in eccentric amount, belt thickness, and the like of the rollers 13 and 14 generate a variation in speed of the transport belt 16. This causes a variation in period of an output pulse of the linear encoder 28.

Figure 6:
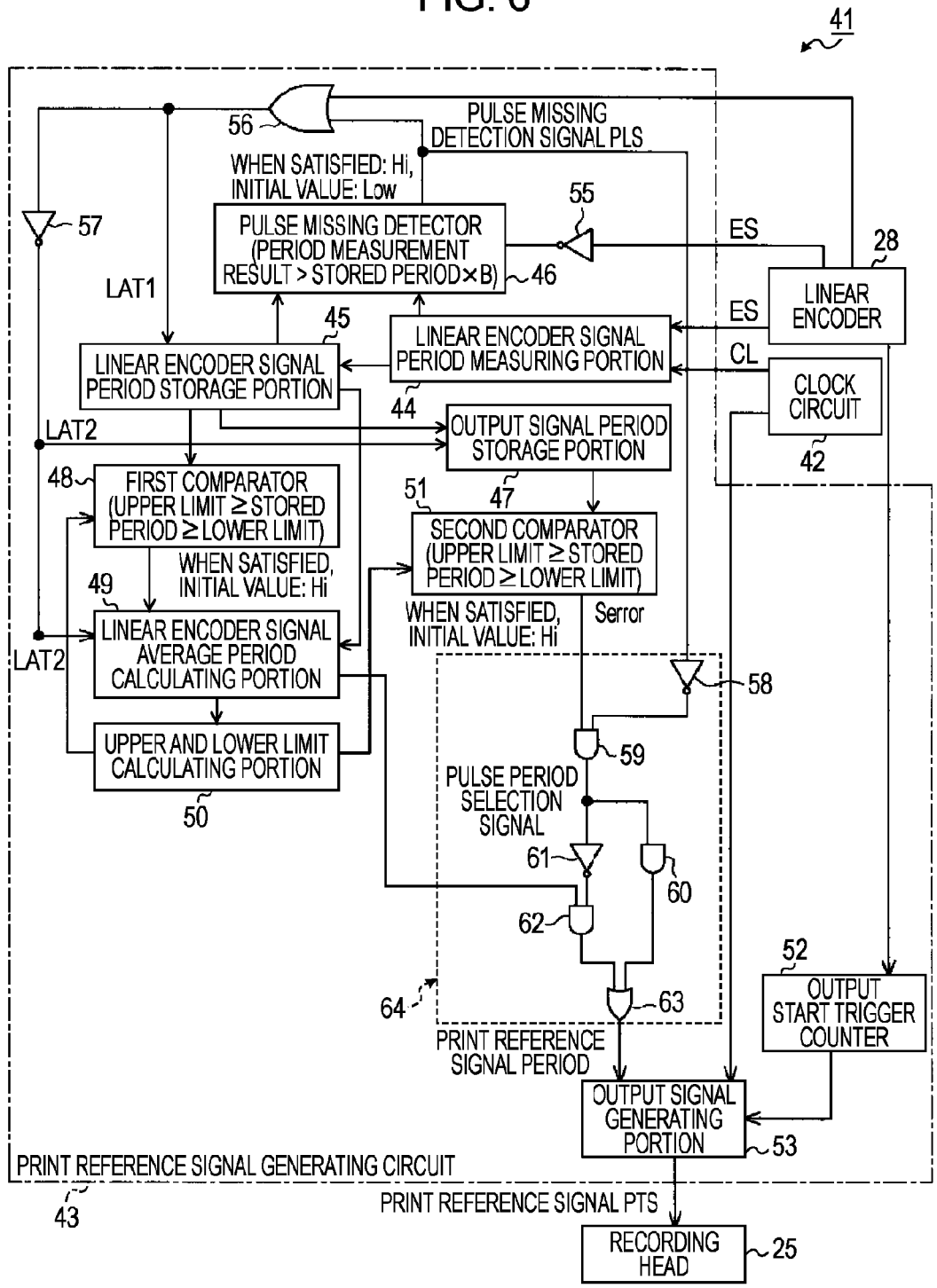
FIG. 6 is a circuit diagram illustrating the electrical configuration of a print reference signal generating device.
Figure 9:
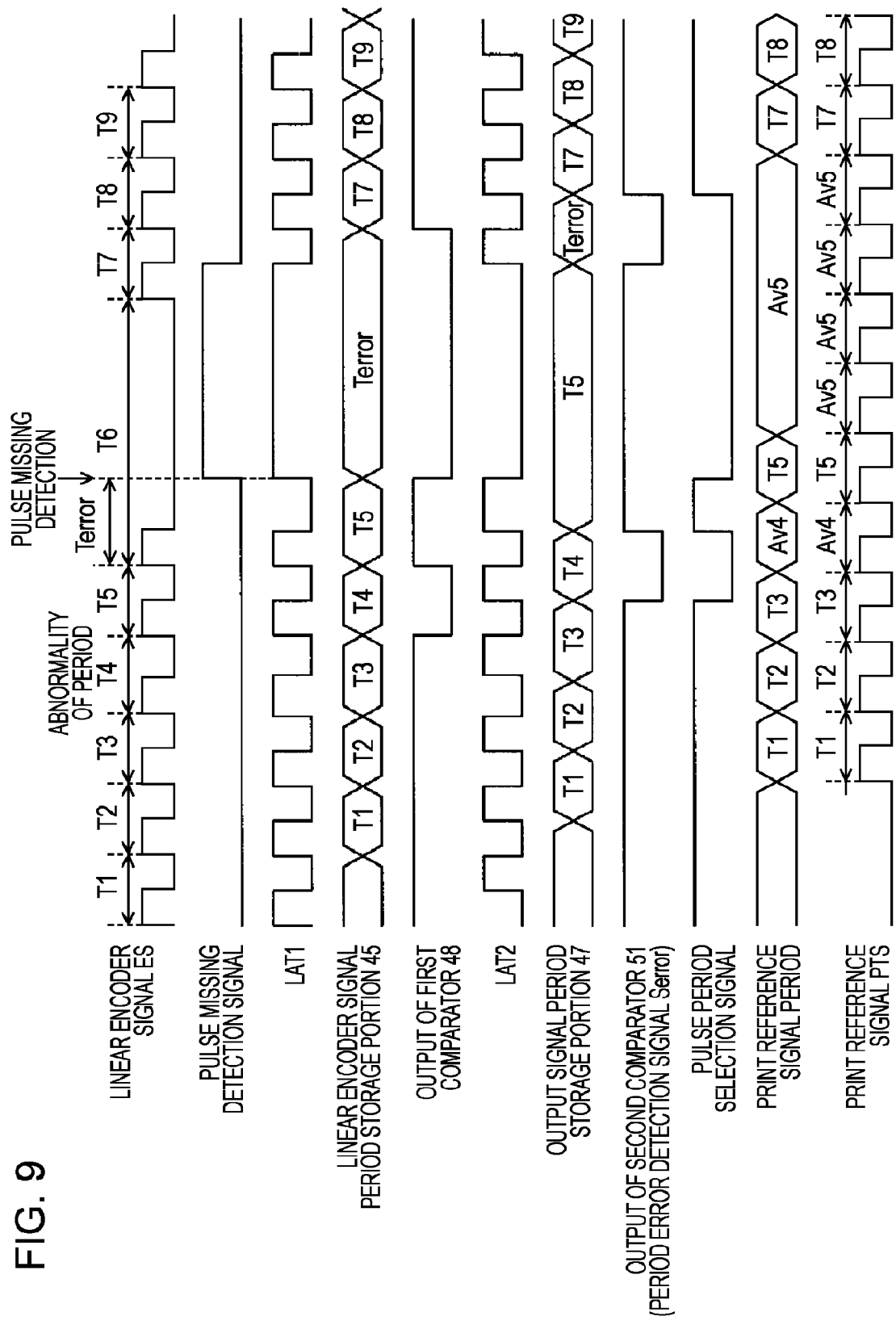
FIG. 9 is a timing chart illustrating an operation of a print reference signal generating device.

FIG. 6 shows a print reference signal generating device provided in the controller 30. In addition, FIG. 9 shows a signal timing chart in the print reference signal generating device. In addition, the print reference signal generating device in the present embodiment is an example in a case where the linear encoder 28 is one sensor. Hereinafter, an explanation will be made according to FIG. 6 while referring to FIGS. 9 and 10 as needed.

A print reference signal generating device 41 as a pulse signal generating device includes the linear encoder 28, a clock circuit 42, and a print reference signal generating circuit 43. The print reference signal generating device 43 generates the print reference signal PTS on the basis of the encoder signal ES (encoder pulse) from the linear encoder 28 and a reference clock signal CL from a clock circuit 42 and outputs the print reference signal PTS to the recording head 25.

In the recording head 25, a discharge driving element (not shown) in which a head driving circuit is provided for every nozzle is driven according to the timing of the print reference signal PTS on the basis of print data, such that an ink droplet is ejected from a nozzle corresponding to the driven discharge driving element. In addition, for example, an electrostatic driving element, a heater, and a piezoelectric vibration element used in an ink jet system may be adopted as the discharge driving element.

As shown in FIG. 6, the print reference signal generating circuit 43 includes: a linear encoder signal period measuring portion (hereinafter, referred to as a 'period measuring portion 44') as a measurement unit; a linear encoder signal period storage portion 45 that forms a storage unit; a pulse missing detector 46 (comparator) as a detection unit; an output signal period storage portion 47 that forms the storage unit; a first comparator 48; a linear encoder signal average period calculating portion (hereinafter, referred to as an 'average period calculating portion 49') as an operation unit; an upper and lower limit calculating portion 50; a second comparator 51; an output start trigger counter 52; and an output signal generating portion 53.

The period measuring portion 44 is input with the linear encoder signal ES from the linear encoder 28 and the reference clock signal CL from the clock circuit 42 and measures a pulse period of the linear encoder signal ES by counting the number of pulses of the reference clock signal CL, which is input from rising of one pulse of the linear encoder signal ES to rising of a next pulse. This period measurement result is stored in the linear encoder signal period storage portion 45. In addition, a processing step in which the period measuring portion 44 measures a pulse period is equivalent to a measurement step.

The pulse missing detector 46 operates only when the linear encoder signal ES has a Low level in order to cause an inversion signal, which is obtained by a NOT operation of the linear encoder signal ES in a NOT circuit 55, to become an enable signal. The pulse missing detector 46 compares and determines whether or not the conditional expression shown in the following expression (1) is satisfied on the basis of the measured period that the period measuring portion 44 has measured this time and a previous measured period (stored period) input from the linear encoder signal period storage portion 45.

$$\text{Measured period } T_{new} > \text{stored period } T_{old} \times \text{detection setting value } B \quad (1)$$

Here, the detection setting value B is a set value that decides a rate related to determining that there is pulse missing (pulse lack) when a period for which a pulse does not appear becomes how many times of the previous measured period Told (stored period). The detection setting value B is set to a value in a range of 1.3 to 2, for example. The pulse missing detector 46 outputs the pulse missing detection signal PLS that has a Hi level at the time of pulse missing detection in which the conditional expression Tnew>Told×B shown in the expression (1) is satisfied and has a Low level at the time of no detection of pulse missing. In addition, since the period measuring portion 44 transmits a period measurement result to the pulse missing detector 46 for every clock count up, a comparison operation is performed in real time in the pulse missing detector 46.

An OR circuit 56 outputs a result of an OR operation between the linear encoder signal ES and the pulse missing detection signal input from the pulse missing detector 46, as a latch signal LATH, to the linear encoder signal period storage portion 45. The period measurement result of the period measuring portion 44 is latched to the linear encoder signal period storage portion 45 at timing of rising of the latch signal LAT1 input from the OR circuit 56 (refer to FIG. 9). The linear encoder signal period storage portion 45 can store a linear encoder signal period in case where there is no pulse missing and a measured period Terror until a point of time of pulse missing detection in case where there is pulse missing (refer to FIG. 9). In addition, a result obtained by performing a NOT operation of the latch signal LAT1 output from the OR circuit 56 in a NOT circuit 57 is input as a latch signal LAT2 to the output signal period storage portion 47 and the average period calculating portion 49. Since the latch signal LAT2 rises in a state of being delayed by the half period phase from the latch signal LAT1, a period measurement result (output signal period) is latched to the output signal period storage portion 47 in a state of being delayed by the half period compared with the linear encoder signal period storage portion 45. In addition, a processing step in which the output signal period storage portion 47 stores an output signal period (period measurement result) is equivalent to a storage step.

The measured period result (stored period) stored in the linear encoder signal period storage portion 45 is transmitted to the first comparator 48 and the average period calculating portion 49. The first comparator 48 compares and determines whether or not the stored period falls within in an appropriate period range by using upper and lower limits calculated in the upper and lower limit calculating portion 50. When the stored period falls within in the appropriate period range, the first comparator 48 outputs an enable signal with a Hi level to the average period calculating portion 49. The average period calculating portion 49 calculates an average period (pulse period average) in synchronization with the latch signal LAT2 by using only a stored period that falls within the appropriate period range. The calculated average period is transmitted to the upper and lower limit calculating portion 50, and the upper and lower limit calculating portion 50 calculates ±A % of the average period as an upper and lower limits. Then, the upper and lower limits calculated by the upper and lower limit calculating portion 50 are transmitted to the first comparator 48 and the second comparator 51 and are set as upper and lower limits in the conditional expression used for comparison determination processing. In addition, since the first comparator 48 outputs Hi as an initial value, a period measurement result that is first transmitted from the linear encoder signal period storage portion 45 is used for average period calculation and upper and lower limit calculation without comparison.

Figure 10:
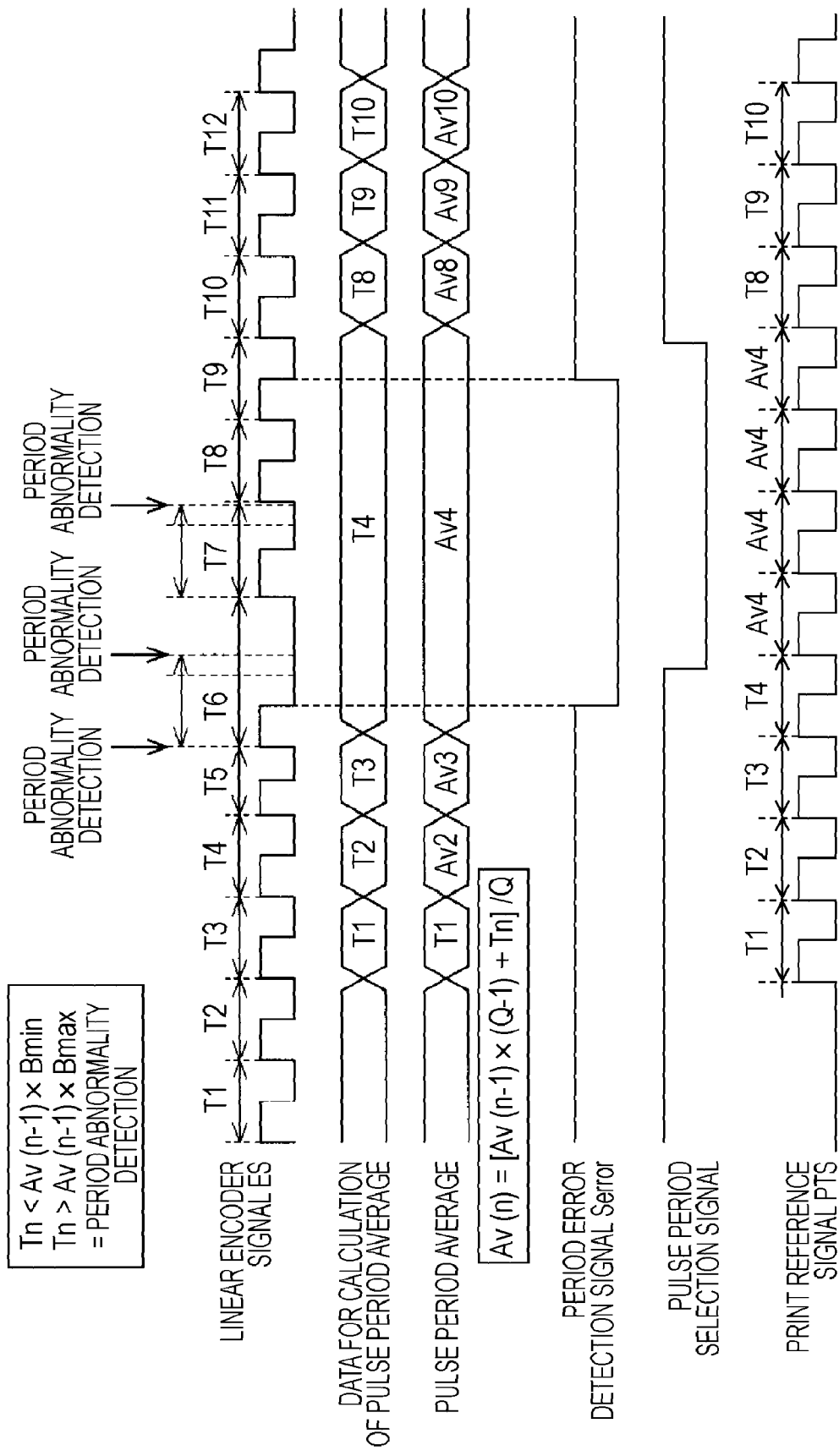
FIG. 10 is a timing chart illustrating an operation when the period abnormalities are detected.

The average period calculating portion 49 calculates an average period (pulse period average) Av(n) on the basis of the following expression (2) using a period measurement result (stored period Tn as a measured period this time (n-th time)) before two pulses, which is stored in the linear encoder signal period storage portion 45, as data for period average calculation as shown in FIG. 10.

$$Av(n)=(Av(n-1)\times(Q-1)+Tn)/Q \quad (2)$$

Here, Av(n) is an average period this time (n-th time), Av(n−1) is an average period in previous time ((n−1)-th time), and Q is the average number of data (number of measured periods). The average period calculating portion 49 includes a storage portion (for example, a register) that stores past data used for calculation of an average period. In the storage portion, the average period Av(n−1) in previous time ((n−1)-th time) and the number of data Q are stored. For example, the number of data Q is a numeric value, such as maximum '16', '64', '128', and '256'. It is possible to calculate the average period Av(n) almost equal to averaging 'Q' measured period data only by preparing a storage region where the previous average period Av(n−1) and the number of data Q can be stored. The average period Av(n) calculated by the average period calculating portion 49 is transmitted to the upper and lower limit calculating portion 50. Moreover, in this example, a predetermined number M less than Q which includes three data items of a previous reasonable period, a current measured period, and the number of data Q (Q=n in this example) is 3 (M=3). Moreover, using the expression (2), a current reasonable period can be calculated using M (3 in this example) data items. In addition, the expression (2) corresponds to an operation expression equivalent to a statistical calculation expression ((T1+T2+ . . . +Tn)/Q) calculating the current reasonable period on the basis of the measured period of Q pulses. The equivalent operation expression may be changed appropriately. The predetermined number M may be the number (less than Q) of data required for calculating a reasonable period using the adopted equivalent operation expression. In addition, a processing step in which the average period calculating portion 49 calculates an average period is equivalent to an operation step.

The upper and lower limit calculating portion 50 calculates values of ±A (%) of the average period Av(n−1) as a lower limit Tmin and an upper limit Tmax. For example, if A (%) is 2%, the lower limit Tmin is calculated as Tmin=Av(n−1)× 0.98, and the upper limit Tmax is calculated as Tmax=Av(n)× 1.02. In this case, assuming that coefficients by which the period average Av(n−1) is multiplied to calculate the upper and lower limits are Bmin and Bmax, the lower limit Tmin is calculated as Tmin=Av(n−1)×Bmin and the upper limit Tmax is calculated as Tmax=Av(n−1)×Bmax. In addition, a set value of A (%) that decides a period limiting value (upper and lower limits) is set at the time of shipment or by a user. Bmin and Bmax are expressed as Bmin, Bmax=(100±A)/100 using the set value A (%). The upper and lower limits calculated by the upper and lower limit calculating portion 50 are transmitted to the first comparator 48 and the second comparator 51 and are used for comparison determination this time (n-th time).

The first comparator 48 and the second comparator 51 determines whether or not the stored period Tn falls within the appropriate period range (normal range) by comparing and determining whether or not the conditional expression shown in the following expression (3) is satisfied.

$$Av(n-1) \times Bmin < Tn < Av(n-1) \times Bmax \quad (3)$$

When the conditional expression (3) is satisfied and the stored period Tn falls within the appropriate period range, the first comparator 48 transmits an enable signal with a Hi level to the average period calculating portion 49 and the average period calculating portion 49 updates the average period Av(n) using the stored period Tn. On the other hand, when the conditional expression (3) is not satisfied, that is, when the stored period Tn deviates from the appropriate period range and period abnormalities are detected, an enable signal is not transmitted to the average period calculating portion 49.

Accordingly, since an abnormal period is not used for calculation of the average period Av(n) in the average period calculating portion 49, the reliable average period Av(n) is stored in the average period calculating portion 49.

On the other hand, the second comparator 51 compares and determines whether or not the stored period Tn acquired from the output signal period storage portion 47 at timing of the latch signal LAT2 satisfies the conditional expression (3). The second comparator 51 outputs a period error detection signal Serror that has a Hi level if the stored period Tn is within the appropriate period range of the average period Av(n)±A % specified by the conditional expression (3) and that has a Low level if period abnormalities in which the stored period Tn deviates from the appropriate period range are detected.

As shown in FIG. 9, the period error detection signal Serror output from the second comparator 51 has a Hi level when the stored period Tn falls within an appropriate range and has a Low level when the period abnormalities occur and the stored period Tn deviates from the appropriate period range. In addition, when the period abnormalities occur, the period error detection signal Serror falls from the Hi level to the Low level in a state of being delayed by the half period from the end of period measurement. In addition, the processing step in which the second comparator 51 compares and determines whether or not the conditional expression (3) is satisfied to thereby detect period abnormalities is equivalent to a detection step.

The output signals PLS and Serror of the pulse missing detector 46 and the second comparator 51, the stored period Tn of the output signal period storage portion 47, and the average period Av(n) of the average period calculating portion 49 are input to a period selection circuit 64. In the present embodiment, the period selection circuit 64 is configured to include various logic circuits 58 to 63 and selects and outputs a print reference signal period to be adopted when generating the print reference signal PTS. The period selection circuit 64 selects and outputs the stored period Tn from the output signal period storage portion 47 as a print reference signal period at the time of detection of period abnormalities when the pulse missing detection signal PLS changes to a Low level or the period error detection signal Serror changes to a Hi level, while the period selection circuit 64 selects and outputs the average period Av(n) as the print reference signal period at the time of detection of period abnormalities when the pulse missing detection signal PLS changes to a Hi level or the period error detection signal Serror changes to a Low level.

The period selection circuit 64 has a circuit configuration including: an AND circuit 59 to which an inversion signal, which is obtained by a NOT operation of the pulse missing detection signal PLS in a NOT circuit 58, and the period error detection signal Serror of the second comparator 51 are input; and an AND circuit 60 to which a pulse period selection signal, which is an output of the AND circuit 59, and data of the output signal period Tn (stored period) from the output signal period storage portion 47 are input. Furthermore, the period selection circuit 64 includes an AND circuit 62 to which an inversion signal, which is obtained by a NOT operation of the pulse period selection signal from the AND circuit 59 in a NOT circuit 61, and data of the average period Av(n) from the average period calculating portion 49 are input. Data of a print reference signal period is output from an OR circuit 63 to which outputs of both the AND circuits 60 and 62 are input.

When the pulse selection signal that is an output signal of the AND circuit 59 has a Hi level since the period of the pulse selection signal falls within a normal range, the output signal period Tn from the output signal period storage portion 47 is output as a print reference signal period from the OR circuit 63 through the AND circuit 60. On the other hand, when it is detected that there are abnormalities (abnormalities of pulse missing and abnormalities of period deviation from an appropriate period range) in the output signal period Tn and the pulse selection signal changes to the Low level, the average period Av(n) from the average period calculating portion 49 is output as a print reference signal period from the OR circuit 63 through the AND circuit 62. That is, the period selection circuit 64 outputs the output signal period Tn at the time of normal period when the pulse period selection signal changes to a Low level and outputs the average period Av(n), which was already calculated by the expression (2) without using the output signal period Tn of a pulse with an abnormal period at the time of detection of period abnormalities when the pulse period selection signal changes to a Hi level (refer to FIG. 9). The print reference signal period from the period selection circuit 64 is input to the output signal generating portion 53.

The print reference signal period, the reference clock signal CL, and an output start trigger signal from the output start trigger counter 52 are input to the output signal generating portion 53. The output signal generating portion 53 is a circuit that generates and outputs the print reference signal PTS, which has a print reference signal period as a period, after an output start trigger signal is input. Therefore, the output signal generating portion 53 outputs the print reference signal PTS of the output signal period Tn stored in the output signal period storage portion 47 at the time of normal period detection and outputs the print reference signal PTS of the average period Av(n) calculated in the average period calculating portion 49 at the time of detection of period abnormalities (refer to FIG. 9).

The output start trigger counter 52 is formed by a counter and a comparator and outputs the linear encoder signal ES as an output start trigger signal at a point of time when two falling pulses of the linear encoder signal are counted. That is, an output of the print reference signal PTS is started in synchronization with third pulse rising of the linear encoder signal. The output signal generating portion 53 has a counter and a comparator therein, for example. The output signal generating portion 53 makes an output signal fall to a Low level when a count value (clock count value) of the number of pulses of the reference clock signal CL matches the half of the output signal period stored in the output signal period storage portion 47 and makes the output signal rise to a Hi level when the clock count value reaches the print reference signal period. At a point of time when the output signal has risen to the Hi level, the counter is reset and a comparator counter comparison value of the next pulse is updated referring to the output signal period storage portion 47. Then, when the count value matches the half of the output signal period, the output signal is made to fall to the Low level again.

By repeating this operation, pulses are generated sequentially by connecting the print reference signal periods.

By the above operation, a signal delayed by two pulses, which is shown in FIGS. 9 and 10, can be output as the print reference signal PTS. Therefore, as shown in FIGS. 9 and 10, since the print reference signal PTS is output using a linear encoder signal period before two pulses at the moment when the period abnormalities occur, the print reference signal PTS can be generated without being influenced by the abnormalities in a pulse period.

After detection of pulse missing, the output signal generating portion 53 waits for return to a normal pulse of the linear encoder signal ES while generating the print reference signal PTS using the average period Av(n−1) already calculated at the time of occurrence of pulse missing. At this time, since the print reference signal period is generated after two pulse delay from returning of the linear encoder signal ES to the normal pulse, the print reference signal PTS is generated by connecting pulses with the same average period Av(n) until then. Then, when the print reference signal period is delayed by two pulses after returning to pulse missing and returns to the output signal period Tn, the period of the print reference signal PTS returns to the output signal period Tn. In addition, a processing step in which the output signal generating portion 53 generates the print reference signal PTS is equivalent to a pulse generating step.

Figure 7:
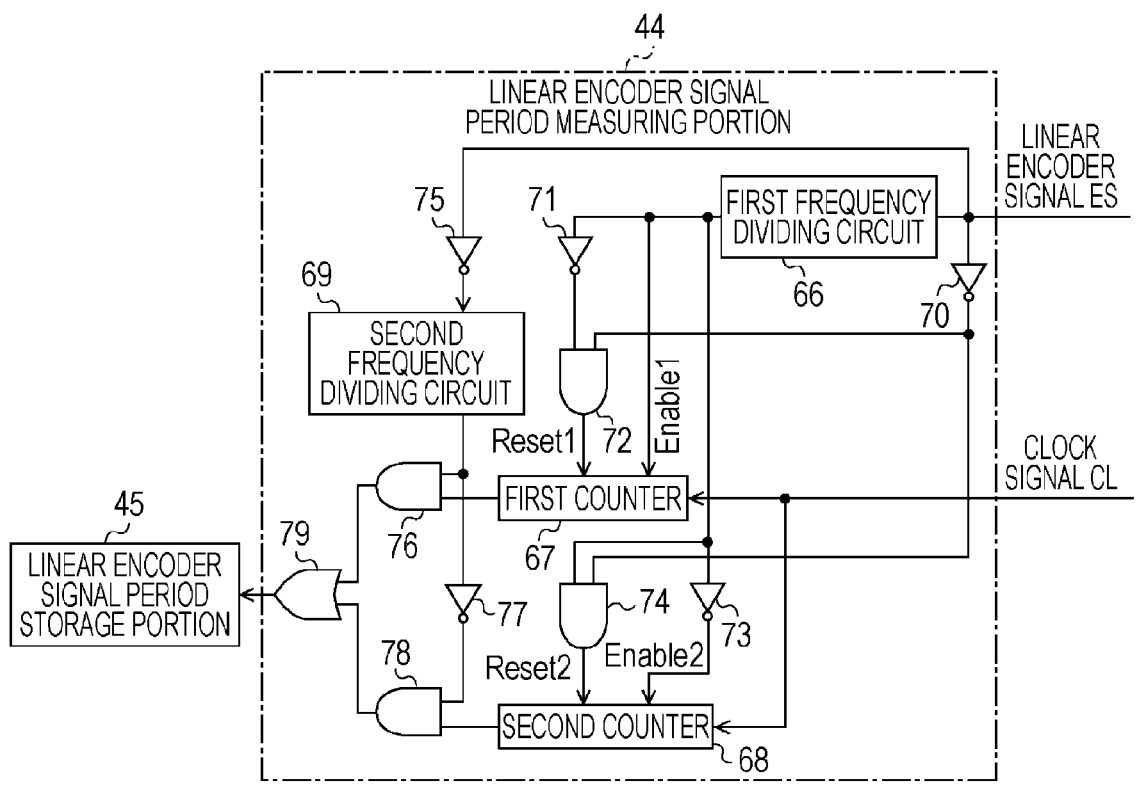
FIG. 7 is an electrical circuit configuration illustrating a linear encoder signal period measuring portion.
Figure 8:
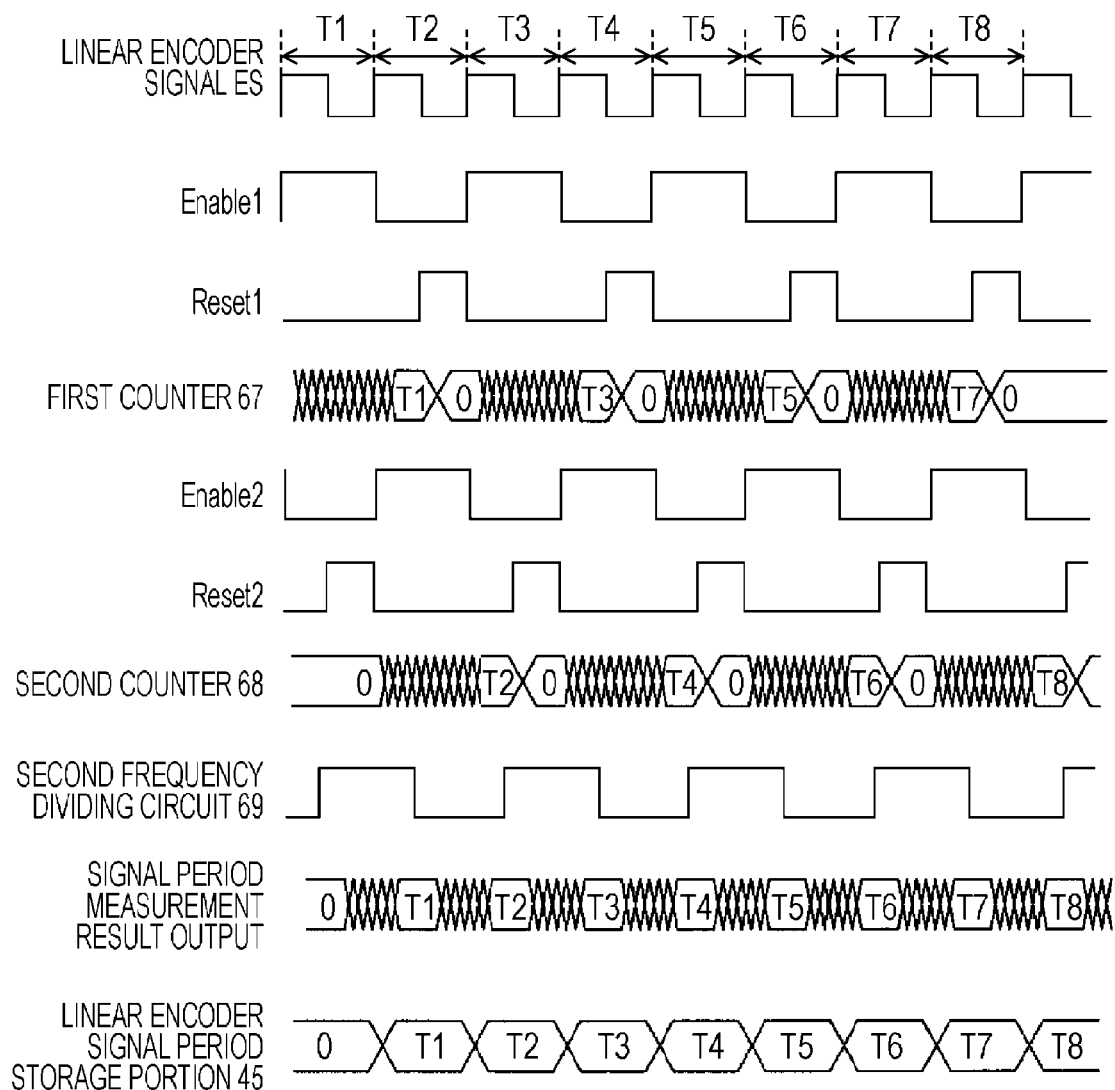
FIG. 8 is a timing chart illustrating an operation of a linear encoder signal period measuring portion.

Next, details of the circuit configuration of the period measuring portion 44 will be described. FIG. 7 shows the circuit configuration of a linear encoder signal period measuring portion, and FIG. 8 shows a timing chart of an operation of the period measuring portion 44. Hereinafter, an explanation will be made according to FIG. 7 while referring to FIG. 8 as needed.

As shown in FIG. 7, the period measuring portion 44 includes a first frequency dividing circuit 66, a first counter 67, a second counter 68, and a second frequency dividing circuit 69. Here, the reason why the two counters 67 and 68 are included is that counting and outputting are not performed together but outputting is performed after a count value is decided. The two counters 67 and 68 alternately measure a pulse period of the linear encoder signal ES one at a time. That is, the second counter 68 count a pulse period of a pulse between pulses whose period is counted by the first counter 67.

The first frequency dividing circuit 66 frequency-divides the linear encoder signal ES to have a double period and outputs an enable signal Enable1 for operating the first counter 67 (refer to FIG. 8). The first counter 67 counts the number of pulses of the reference clock signal CL when the enable signal Enable1 is a Hi-level signal.

As shown in FIG. 7, in an AND circuit 72, an AND operation between a result of a NOT operation of the linear encoder signal ES in a NOT circuit 70 and a result of a NOT operation of the enable signal Enable1 in a NOT circuit 71 is performed. Then, the operation result is input to the first counter 67 as a reset signal Reset1. The first counter 67 counts the number of pulses of the reference clock signal CL while the Hi-level enable signal Enable1 that rises over a period of one period of the linear encoder signal ES is being input. When the Low-level enable signal Enable1 is input, the first counter 67 stops counting and holds the count value until the reset signal Reset1 is input. Then, when the reset signal Reset1 is input, the counter is reset to zero to prepare for measurement of a next pulse.

Furthermore, as shown in FIG. 8, an enable signal Enable2 obtained when the enable signal Enable1 is inverted by a NOT operation in a NOT circuit 73 is input to the second counter 68. The second counter 68 counts the number of pulses of the reference clock signal CL when the enable signal Enable2 is a Hi-level signal.

In an AND circuit 74, an AND operation between the enable signal Enable1 and a result of a NOT operation of the linear encoder signal ES in the NOT circuit 70 is performed. Then, the operation result is input to the second counter 68 as a reset signal Reset2. Accordingly, the second counter 68 counts a pulse period between pulse periods, which are counted by the first counter 67, among pulse periods of the linear encoder signal ES.

The second frequency dividing circuit 69 shown in FIG. 7 is input with a signal obtained when the linear encoder signal ES is inverted by a NOT operation in a NOT circuit 75 and frequency-divides the input signal to a double period (refer to FIG. 8). An AND circuit 76 outputs to an OR circuit 79 a result of an AND operation between an output of the second frequency dividing circuit 69 and an output of the first counter 67. In addition, an AND circuit 78 outputs to the OR circuit 79 a result of an AND operation between a result of a NOT operation of the output of the second frequency dividing circuit 69 in a NOT circuit 77 and an output of the second counter 68. That is, the AND circuit 76 outputs the output of the first counter 67 to the OR circuit 79 when the output of the second frequency dividing circuit 69 has a Hi level, and the AND circuit 78 outputs the output of the second counter 68 to the OR circuit 79 when the output of the second frequency dividing circuit 69 has a Low level. In this way, the count result of the first counter 67 input from the AND circuit 76 and the count result of the second counter 68 input from the AND circuit 78 are alternately output from the OR circuit 79. The output data of the OR circuit 79 is output, as a signal period measurement result shown in FIG. 8, to the linear encoder signal period storage portion 45 and the pulse missing detector 46. As a result, as shown in FIG. 8, measured pulse periods T1, T2, T3, . . . of the linear encoder signal ES are sequentially stored in the linear encoder signal period storage portion 45 in a state of being delayed by one period.

Here, the linear encoder signal period storage portion 45 stores data corresponding to two pulses in a memory (register) since a memory capacity (consumption amount of a memory space) is uselessly consumed if the linear encoder signal period storage portion 45 stores unnecessarily many past period measurement data. This corresponds to that the output signal generating portion 53 outputs a signal, which is obtained by delaying the linear encoder signal ES by two pulses, as a print reference signal.

The print reference signal generating device configured as described above operates as follows. As shown in FIG. 9, when a period of the linear encoder signal ES is normal, the pulse missing detection signal PLS has a Low level and the period error detection signal Serror has a Hi level. Accordingly, since the pulse period selection signal has a Hi level, the print reference signal PTS having the same period as the measured period Tn before two pulses, which is stored in the output signal period storage portion 47, is generated on the basis of the print reference signal period. On the other hand, when a period of the linear encoder signal ES deviates from the appropriate period range or pulse missing occurs, that is, when period abnormalities are detected, the print reference signal PTS having as a period the output signal period Tn that is a measured period before two pulses is generated at the moment when the period abnormalities occur. Then, after the pulse period selection signal falls from the Hi level to the Low level, the print reference signal PTS having the same period as the average period (pulse period average) Av(n) already calculated according to the expression (2) using the measured period before two pulses is generated on the basis of the print reference signal period.

Figure 11:
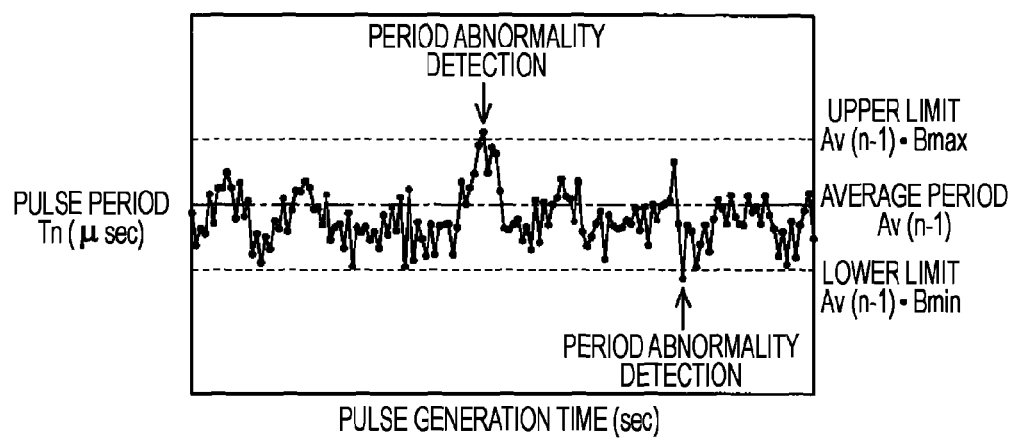
FIG. 11 is a graph illustrating detection of period abnormalities using a linear encoder signal.

FIG. 11 is a graph of an example illustrating the situation of a change in pulse period of a linear encoder signal. A horizontal axis indicates a pulse generation time, and a vertical axis indicates a pulse period. The appropriate period range set to determined the period abnormalities is specified for every device according to the individual difference of the device from the average period Av(n), which is the average of Q past data calculated using the measured period of the linear encoder signal ES, and has a lower limit Av(n)·Bmin and an upper limit Av(n)·Bmax. Accordingly, only when a period is abnormal in the corresponding device, period abnormalities are detected. However, according to the abnormal period detection method disclosed in JP-A-2004-21236, lower and upper limits that specify the appropriate period range are fixed values. For this reason, a case where erroneous detection is performed due to deviation from the appropriate period range in spite of a normal period has occurred frequently. On the other hand, according to the device according to the present embodiment, such erroneous detection can be avoided.

As described above, according to the first embodiment, the following effects are obtained.

(1) A pulse period of the linear encoder signal ES is measured, the average period Av(n) that is the average of Q past data is calculated using the measured pulse period, and a case where the measured period (stored period) Tn deviates from the appropriate period range (normal range) specified from the average period Av(n) is detected as the period abnormalities. Therefore, since the reasonable period range is decided from an average period based on a measured period for every device even if there is an individual difference of the device, it is possible to prevent detection of period abnormalities that is erroneously performed due to the situation where threshold values of the appropriate period range are fixed values even though the measured period is normal, which was the problem in the method disclosed in JP-A-2004-21236. As a result, since it can be reduced that an acting period at the time of erroneous detection is adopted even though a measured period is normal, the reliable print reference signal PTS can be generated. Moreover, as an acting period adopted instead of the measured period Tn (output signal period) at the time of detection of period abnormalities, the average period Av(n) is adopted. Accordingly, the print reference signal PTS with a reliable period can also be generated at the time of detection of period abnormalities.

(2) The print reference signal PTS is generated by sequentially outputting pulses at intervals of a print reference signal period. Accordingly, even if the print reference signal period is switched between the measured period Tn and the average period Av(n) when the period is normal and when the period abnormalities are detected, the period abnormalities do not occur in an output signal before and after the switching (before or after period abnormality detection). Accordingly, it is not necessary to take the phase difference of signals before and after period abnormality detection into consideration, and there is also no need for precise centering of the roller 13 and the like since a variation in the speed of the transport belt 16 is more or less permissible.

(3) Even if lack of a pulse of the linear encoder signal ES resulting from the joint of the transport belt 16 or adhesion of paper particles or ink mist occurs, the print reference signal PTS with an appropriate pulse period can be output since the print reference signal PTS is generated with the average period Av(n). Accordingly, since a pulse with a relatively precise period can be added by interpolation even if lack of a linear encoder pulse occurs suddenly, the print reference signal PTS without lack of a pulse can be generated. Moreover, since a period measurement result before several pulses (before two pulses in this example) is set as a period measurement result used by the print reference signal, it is possible to prevent missing from occurring also in the print reference signal PTS when pulse missing occurs in a linear encoder signal.

(4) The average period calculating portion 49 performs calculation on the basis of the expression (2) using three data of the previous ((n−1)-th) average period Av(n−1), the current measured period (stored period) Tn, and the number of data Q. Accordingly, even if the number of data Q averaged is a relatively large value, such as '16' or '128', it is possible to calculate the average period Av(n) almost equal to averaging 'Q' measured period data only by preparing a storage region where the previous average period Av(n−1) and the number of data Q can be stored. As a result, the reliable average period Av(n) can be used by increasing the number of data Q, and the number of data to be stored for calculation of the average period Av(n) can be suppressed small at the rate of the number of data Q. Thus, the storage capacity of a register or the like to be prepared can be set as small as possible.

(5) In the printer 11 configured to include the belt transport device 12 provided with the print reference signal generating device 41, even if pulse missing occurs due to the speed variation in the transport belt 16, a belt joint, or adhesion of paper particles, the printing image quality can be improved since the print reference signal PTS is generated with an appropriate pulse period. For example, in the case where the print reference signal PTS is generated on the basis of an abnormal period at the time of speed variation in the transport belt 16, there is a disadvantage that the print reference signal PTS is generated with a period at the time of speed variation before two pulses when the transport belt speed is normal. However, in the device according to the present embodiment, such a disadvantage can be eliminated.

(Second Embodiment)

In the present embodiment, a disadvantage that the print reference signal PTS with the average period Av(n) is continuously generated when the period abnormalities continue in one linear encoder is eliminated. Therefore, in the present embodiment, two sensors are used to form a linear encoder. If the period abnormalities are detected in one of the two sensors that adopts a print reference signal period, the print reference signal PTS is generated by switching the sensor that adopts the print reference signal period to the other sensor. In addition, since the configuration of the printer 11 is the same as that in the first embodiment, the configuration and operation of a print reference signal generating device will be described in detail with reference to FIGS. 12 to 15.

Figure 12:
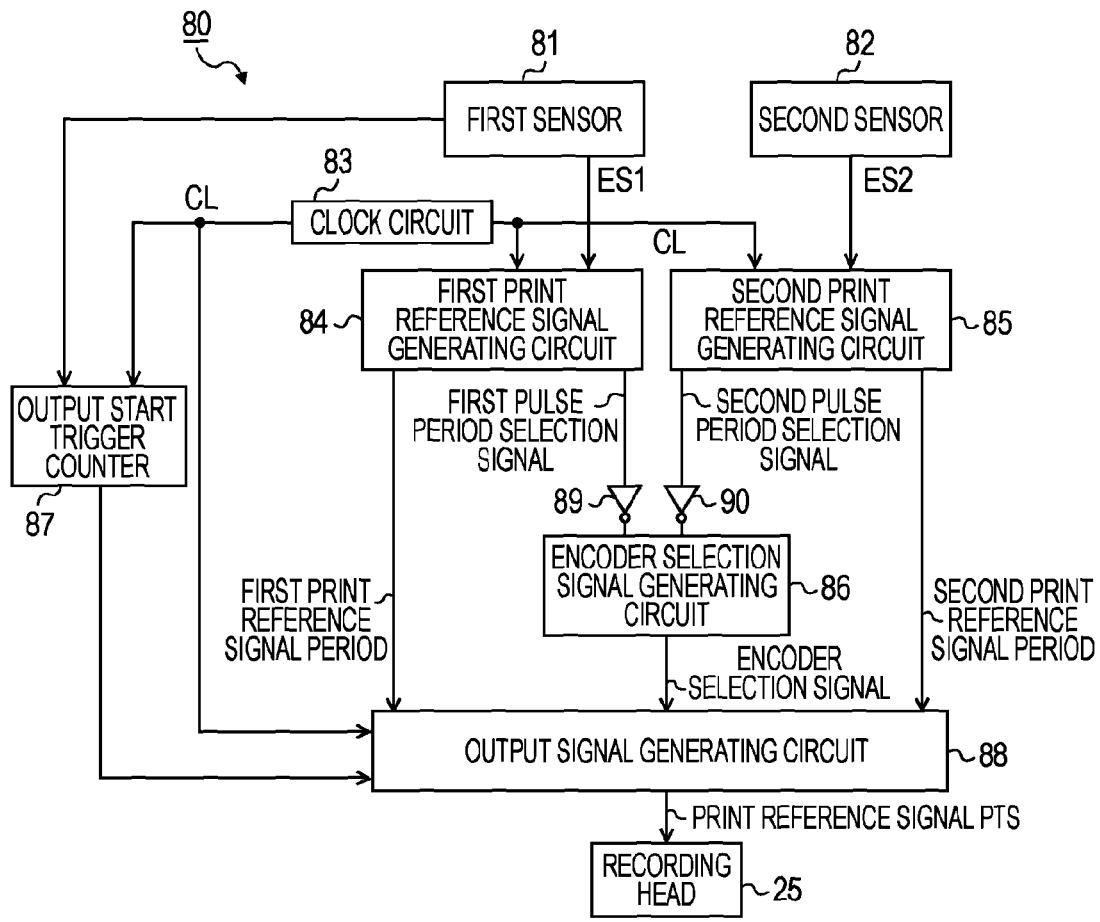
FIG. 12 is a circuit diagram illustrating the electrical configuration of a print reference signal generating circuit in a second embodiment.

FIG. 12 shows the circuit configuration of a print reference signal generating device provided in the controller 30. As shown in FIG. 12, a print reference signal generating device 80 includes a first sensor 81, a second sensor 82, a clock circuit 83, a first print reference signal generating circuit 84, a second print reference signal generating circuit 85, an encoder selection signal generating circuit 86, an output start trigger counter 87, and an output signal generating circuit 88.

The first sensor 81 and the second sensor 82 are formed by the same magnetic sensor as in the first embodiment and are disposed at predetermined positions for detecting different positions on the magnetic linear scale 26. For example, the positions of the first and second sensors 81 and 82 are set such that while one of the first and second sensors 81 and 82 is detecting a portion of a joint of the transport belt 16, the other one detects a portion without a joint. In practice, the first and second sensors 81 and 82 are disposed at different positions, which are separated from each other by a predetermined distance within a range of 1 to 20 cm, for example, in the transport direction on the magnetic linear scale 26. Moreover, the magnetic linear scale 26 in the present embodiment has a width corresponding to two rows. The sensors 81 and 82 are disposed to perform detection at different positions in the width direction of the magnetic linear scale 26.

Both the first print reference signal generating circuit 84 and the second print reference signal generating circuit 85 have the same circuit configuration as the print reference signal generating circuit 43 of FIG. 6 except that the output start trigger counter 52 and the output signal generating portion 53 are removed from the print reference signal generating circuit 43 of FIG. 6 in the first embodiment.

The first print reference signal generating circuit 84 is input with a linear encoder signal ES1 from the first sensor 81 and a reference clock signal CL and outputs a first pulse period selection signal and a first print reference signal period. In addition, the second print reference signal generating circuit 85 is input with a linear encoder signal ES2 from the second sensor 82 and the reference clock signal CL and outputs a second pulse period selection signal and a second print reference signal period. In addition, each of the first and second pulse period selection signals is a signal equivalent to the pulse period selection signal in FIG. 6, and each of the first and second print reference signal periods is a signal equivalent to the print reference signal period in FIG. 6.

The encoder selection signal generating circuit 86 is a circuit to which an inversion signal, which is obtained by a NOT operation of the first pulse period selection signal from the first print reference signal generating circuit 84 in a NOT circuit 89 (inverter), and an inversion signal, which is obtained by a NOT operation of the second pulse period selection signal from the second print reference signal generating circuit 85 in a NOT circuit 90, and which outputs an encoder selection signal.

The output signal generating circuit 88 is input with the first print reference signal period from the first print reference signal generating circuit 84, the second print reference signal period from the second print reference signal generating circuit 85, and the encoder selection signal from the encoder selection signal generating circuit 86 and generates a print reference signal PTS having the same period as one of the first and second print reference signal periods selected on the basis of the encoder selection signal. In the present embodiment, the output signal generating circuit 88 selects the first print reference signal period when the encoder selection signal has a Low level. The output signal generating circuit 88 is configured to select the second print reference signal period when the encoder selection signal has a Hi level and generates the print reference signal PTS having the same period as the print reference signal period of the selected one. At this time, the output signal generating circuit 88 starts an output of the print reference signal PTS based on an output start trigger signal from the output start trigger counter 87. The output signal generating circuit 88 is configured to include a counter and a comparator, for example. Then, after the output start trigger signal is input, the output signal generating circuit 88 outputs the print reference signal having the same period as the print reference signal period by generating a pulse that falls when a count value (clock count value) of a counter, which counts the number of pulses of the reference clock signal CL from the clock circuit 83, reaches a value equivalent to the half period of the print reference signal period and rises when the clock count value reaches a value equivalent to the print reference signal period.

Figure 13A:
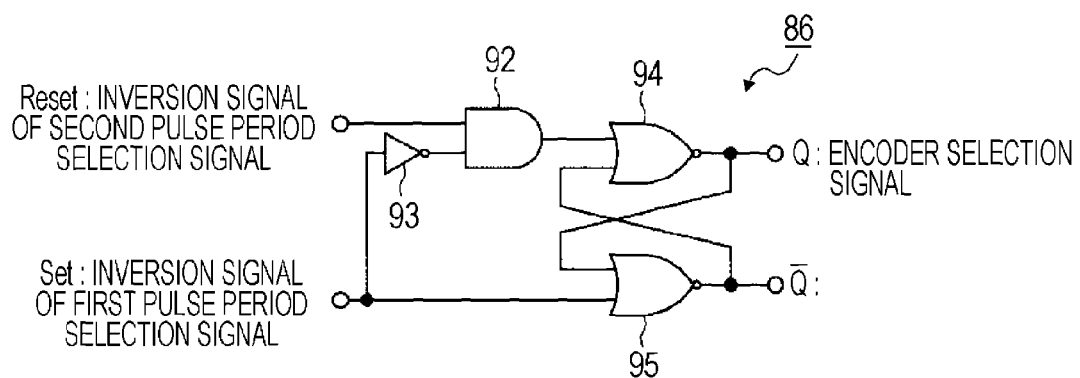
FIG. 13A is a circuit diagram of an encoder selection signal generating circuit.
Figure 13B:
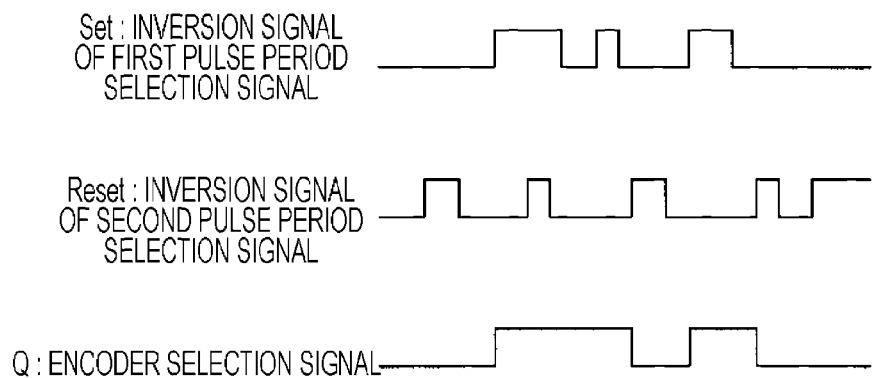
FIG. 13B is a timing chart illustrating an operation of the encoder selection signal generating circuit.

FIG. 13A shows the circuit configuration of the encoder selection signal generating circuit 86, and FIG. 13B shows the timing chart of an input/output signal of the encoder selection signal generating circuit 86. As shown in FIG. 13A, the encoder selection signal generating circuit 86 is configured to include: an AND circuit 92 to which the second pulse period selection signal of the second sensor 82, which is a Reset input, and an inversion signal obtained by a NOT operation of the first pulse period selection signal of the first sensor 81, which is a Set input, in a NOT circuit 93; and an RS-FF (reset flip-flop) to which an output of the AND circuit 92 is Reset input and the first pulse period selection signal of the first sensor 81 is Set input. The RS-FF includes a NOR circuit 94 to which the output of the AND circuit 92 is input and a NOR circuit 95 to which the first pulse period selection signal is input. The NOR circuits 94 and 95 are connected such that an output of each of the NOR circuits 94 and 95 becomes an input of the other NOR circuit. The RS-FF outputs an encoder selection signal from a Q terminal.

FIG. 13B shows the timing chart of the encoder selection signal generating circuit 86. Both the inversion signals of the first and second pulse period selection signals input to the encoder selection signal generating circuit 86 changes to a Low level at the time of normal period detection and changes to a Hi level at the time of abnormal period detection. When the inversion signal of the first pulse period selection signal rises, the encoder selection signal rises from the Low level to the Hi level. On the other hand, when the inversion signal of the second pulse period selection signal rises in a state where the inversion signal of the first pulse period selection signal has a Low level, the encoder selection signal falls. Accordingly, the inversion signal of the first pulse period selection signal rises when the first sensor 81 detects period abnormalities and the encoder selection signal rises from the Low level to the Hi level, such that switching between sensors is performed. Then, the period abnormality detection of the first sensor 81 is not performed (that is, returning to the normal period). As a result, even if the inversion signal of the first pulse period selection signal falls, returning to the first sensor is not performed until the inversion signal of the second pulse period selection signal rises next by detection of period abnormalities of the second sensor.

For this reason, the encoder selection signal generating circuit 86 suppresses frequent switching between the first and second sensors 81 and 82. The encoder selection signal generating circuit 86 performs switching only when the period abnormalities are detected by a sensor in use and the other sensor is normal. This reduces a probability of using an unstable signal immediately after returning from an abnormal period to a normal period. Moreover, it becomes possible to prevent phase shift by generating the print reference signal PTS by connection of print reference signal periods. In addition, even if there is long pulse missing, the print reference signal PTS that enables printing corresponding to the belt transport speed variation can be generated.

FIGS. 14 and 15 show timing charts of various signals in the print reference signal generating device 80 according to the present embodiment which uses two encoder sensors. Moreover, in FIGS. 14 and 15, a pulse period of the first linear encoder signal ES1 output from the first sensor 81 is set to tn (where, n=1, 2, . . . ) and a pulse period of the second linear encoder signal ES2 output from the second sensor 82 is set to Tn (where n=1, 2, . . . ).

FIG. 14 shows an example where the period abnormalities, in which a stored period deviates from an appropriate period range, occur in the first linear encoder signal ES1 output from the first sensor 81. When the period abnormalities are detected, the first pulse period selection signal falls to a Low level, and an average period tAv4 is output as a first print reference signal period delayed by two pulses in a period abnormality detection section. At this time, a normal period is detected in the second linear encoder signal ES2 output from the other second sensor 82, and the stored period Tn is output as a second print reference signal period. When the period abnormalities are detected in the first linear encoder signal ES1 from the first sensor 81, the encoder selection signal rises from the Low level to the Hi level as shown in FIG. 14. As a result, switching from the first print reference signal period tn, which has been used to generate the print reference signal PTS until then, to the second print reference signal period Tn is performed.

FIG. 15 shows an example when period abnormalities, such as pulse missing, occur in both the sensors 81 and 82. When the period abnormalities are detected in the first linear encoder signal ESP, the first pulse period selection signal falls to the Low level, switching to an output signal period tn is performed in a period corresponding to the period abnormality detection section, and the average period tAv4 is output as the first print reference signal period. At this time, the period abnormalities are also detected in the second linear encoder signal ES2 output from the other second sensor 82, the second pulse period selection signal falls to the Low level, switching to the output signal period tn is performed in a period corresponding to the period abnormality detection section, and average periods TAv5 and TAv9 are output as the second print reference signal period.

As shown in FIG. 15, the encoder selection signal rises in falling of the first pulse period selection signal. Then, when the period abnormalities are no longer detected (that is, returning to a normal period detection state) and the first pulse period selection signal rises and then the period abnormalities are detected in the second linear encoder signal ES2 and the second pulse period selection signal falls, the encoder selection signal falls first.

In a first encoder (Enc1) used section where the encoder selection signal has a Low level, the first print reference signal period is selected and the print reference signal PTS is generated on the basis of first print reference signal periods t1, t2, t3, and t4. In a second encoder (Enc2) used section where the encoder selection signal has a High level, the second print reference signal period is selected and the print reference signal PTS is generated on the basis of second print reference signal periods T4, T5, TAv5, T7, T8, and T9. At this time, even if the first linear encoder signal ES1 returns to the normal period detecting state, sensor switching is not performed and generation of the print reference signal PTS based on the second print reference signal period Tn (or TAvn) continues. Immediately after returning to the normal period detection state from the period abnormality detection state, the pulse period becomes easily unstable even though the pulse period is in a normal period range. However, since sensor switching is not performed even after returning to the normal state, the frequency where the print reference signal PTS is generated by using an unstable pulse period after returning to a normal state of a pulse period of a linear encoder signal is reduced. Accordingly, when the period abnormalities occur in both the sensors 81 and 82 as shown in FIG. 15, lack of the print reference signal PTS is prevented by outputting the average period TAv5 without performing the sensor switching.

In addition, at a point of time when the period abnormalities are detected in the second linear encoder signal ES2 from the second sensor 82 and the second pulse period selection signal falls, the encoder selection signal falls and sensor switching is performed. Then, in a second first encoder (Enc1) used section in FIG. 15 where the encoder selection signal has a Low level, the first print reference signal period is selected and the print reference signal PTS is generated on the basis of first print reference signal periods t10, t11, . . . .

Therefore, according to this second embodiment, the following effects can be obtained.

(6) A configuration where the plurality of sensors 81 (plurality of encoders) are provided, sensor switching is performed when the period abnormalities are detected in a sensor that uses a print reference signal period for generation of the print reference signal PTS, and the print reference signal PTS is generated by using a print reference signal period generated on the basis of a linear encoder signal of the other sensor under normal period detection was adopted. Accordingly, since a frequency where the print reference signal PTS is generated with a period based on a measured period (stored period) of a sensor can be increased, the reliable print reference signal PTS can be output. As a result, it is possible to provide a printer that realizes the higher printing image quality compared with the printer 11 in the first embodiment.

(7) The encoder selection signal generating circuit 86 was configured such that a RS-FF (reset flip-flop) is provided, frequent switching between the first and second sensors 81 and 82 is suppressed, and sensor switching is performed only when the period abnormalities are detected in a sensor in use and the other sensor is normal. Accordingly, since a frequency where an unstable pulse period immediately after returning to the normal period detection state from the period abnormality detection state is used for generation of the print reference signal PTS can be reduced, the more reliable print reference signal PTS can be generated. Moreover, in the print reference signal generating device 41 in the first embodiment, the print reference signal PTS is continuously generated using the old average period Av(n) when there is long pulse missing. However, in the print reference signal generating device 80 in the second embodiment, the situation where the print reference signal PTS is continuously generated using the old average period Av(n) is easily prevented since sensor switching is performed. Also from these points, since the print reference signal PTS with a reliable period can be generated, it is possible to provide the printer 11 that realizes the higher printing image quality.

(8) Since a configuration where the print reference signal PTS is output by connecting print reference signal periods to sequentially generate pulses is adopted, it is possible to prevent the abnormalities in an output signal period from occurring due to the signal phase difference before and after sensor switching, even though the configuration is a configuration where sensor switching is performed.

In addition, the embodiment is not limited to those described above but may be changed as follows.
(First Modification)

In each of the embodiments, a condition where a period measurement result exceeds the average period Av(n)×B (period measurement result>Av(n)×B) may be set as the period abnormality condition (pulse missing detection condition) in the pulse missing detector 46. For example, in the method disclosed in JP-A-2004-21236, pulse missing is also detected as period abnormalities collectively when a measured period exceeds the upper limit. However, if the upper limit is a fixed value, there is a possibility that the frequency of pulse missing and erroneous detection will increase in spite of a normal period in a device where a middle value in the period distribution is shifted upward due to the individual difference of the device. In contrast, if the above-described pulse missing detection condition specified from the average period is adopted, a pulse missing threshold value of the pulse missing detection condition is determined from the average period also in the device where the middle value in the period distribution is shifted upward due to the individual difference of the device. Accordingly, the frequency of being detected as pulse missing in spite of a normal period can be reduced.
(Second Modification)

A statistically reasonable period is not limited to the average period (period average). A weighted average, a cumulative weighted average, an arithmetic mean, a geometric average, a harmonic average, and the like may also be used. Moreover, values that may become unsuitable values, such as a maximum value and a minimum value, may be excluded from objects to be calculated when these averages are calculated. Furthermore, a statistically reasonable value may be used without being limited to the average. For example, statistical values, such as a standard deviation '45' or '55', other than the average may also be adopted as a reasonable value. Moreover, it may be possible to adopt a configuration where a computation expression for calculating the reasonable value is derived by performing statistical analyses from data, which is obtained by measuring a pulse period in the experiment, and a reasonable value is calculated using the computation expression. In addition, the period abnormality condition is not limited to being specified in a range having upper and lower limits but may be a range specified by using only an upper limit or only a lower limit. For example, the period abnormalities may be detected only at the time of measured period Tn<Tmin or only at the time of measured period Tn>Tmax. Moreover, the period abnormality condition may be expressed by the function expression like f(T)>K (for example, 'T' is a measured period and 'K' is a constant determined from a reasonable value). In short, it is sufficient that a condition value for determining whether or not the period abnormality condition is satisfied is not a fixed value but a variable value specified from a reasonable value calculated from a plurality of past measured periods.
(Third Modification)

The normal range specified from a reasonable period is not limited to a range having a reasonable period in the middle. In each of the embodiments, the appropriate period range is not limited to the range having an average period in the middle, but a width between a lower limit and the average period and a width between an upper limit and the average period may be set to different values, for example. For example, a reasonable period may be set as the lower limit or upper limit of the normal range.
(Fourth Modification)

Although the configuration where the period abnormalities are detected using two kinds of conditional expressions of pulse missing detection and deviation from the appropriate period range was adopted, a configuration where the detection unit is formed by using only one of the pulse missing detector 46 and the second comparator 51 may also be adopted. It is needless to say that a configuration where a plurality of period abnormalities are detected by setting three or more kinds of period abnormality conditions may also be adopted.
(Fifth Modification)

Although an application to the linear encoder has been made in the above embodiments, an application to a rotary encoder may also be made. In a configuration where a detection pulse of a rotary encoder is used in case of performing a rotation control of a motor, for example, a pulse signal generating device may also be applied. Moreover, the encoder is not limited to the incremental encoder, but an absolute encoder may be used.
(Sixth Modification)

The transport unit that transports a recording medium, such as paper, is not limited to using the transport belt method. For example, an application to a printer including a roller type transport device, in which a roller device configured to have a pair of driving roller and driven roller is disposed at a plurality of places on the transport path, may be made. For example, a magnetic scale may be provided on a peripheral surface of the end of a roller, or a rotary-encoder-type rotating plate magnetic scale may be provided in a rotation driving shaft of a power transmitting system or a roller. Moreover, in the case of a belt transport method in a line printer, it may also be possible to adopt a configuration where a plurality of belts are wound in a zigzag manner between rollers that are disposed in a pair at each of upstream and downstream sides in the transport direction. In addition, a configuration where a drum not having a transport belt is provided and printing is performed by a recording unit in a condition where recording paper sticks on the outer peripheral surface of the drum may also be adopted.

(Seventh Modification)

The pulse signal generating device may be applied not only to the line printer but also to a serial type printer that performs printing while a recording head is moving (scanning) in a width direction of paper, for example. For example, the print reference signal PTS is generated by providing a linear encoder in parallel with a moving path of a carriage provided with a recording head and inputting the linear encoder signal ES, which moves with the carriage, to the print reference signal generating circuit in each of the embodiments.

(Eighth Modification)

In the second embodiment, three or more sensors may be provided for one linear scale.

(Ninth Modification)

The encoder (linear encoder, rotary encoder) is not limited to the magnetic type, but an optical encoder may be adopted. In the case of the optical encoder, the linear encoder signal ES whose amplitude periodically changes can be obtained by providing slits at fixed pitches in a scale and periodically changing the opening shape or opening area of the slit such that the light receiving amount of an optical detection sensor, which receives light that is emitted from a light source (light-emitting device) and passes through the slit, periodically changes. Moreover, in the case of the optical encoder, a reflective one may also be adopted in addition to the above-described transmissive one.

(Tenth Modification)

The print reference signal generating device is not limited to the hardware configuration. The print reference signal generating device may also be realized by software that performs period measurement processing for measuring a pulse period of an encoder signal, period abnormality detection processing for detecting the period abnormalities, and pulse generation processing for generating a print reference signal on the basis of a measured period before several pulses by causing a CPU (central processing unit) to execute a program stored in a memory.

(Eleventh Modification)

The pulse signal generated by the pulse signal generating device is not limited to generating a print reference signal of a printer. The pulse signal may be widely applied to an encoder signal generating device for a transport device. For example, the encoder signal generating device may be used for detection of the speed of a transport belt or may be used for detection of the position of the transport belt. In these configurations, the precision of speed control can be increased or the precision of position control can be increased by performing the speed control and position control of an actuator, such as a motor, using the encoder signal generating device according to each of the embodiments of the invention. Moreover, a reference pulse signal other than the print reference signal may be generated. In this case, a reference pulse signal with a period different from an encoder signal period may be generated by multiplying or dividing an encoder pulse.

(Twelfth Modification)

In each of the embodiments, it may be possible to adopt a configuration of notifying a user that a linear encoder or the like is to be cleaned when the pulse missing (pulse lack) detection state continues for a predetermined time.

(Thirteenth Modification)

The image forming apparatus is not limited to a printer. For example, an image forming apparatus that draws, as an image, a prescribed pattern (including a wiring line pattern, an electrode pattern, a pixel pattern, an etching pattern, and an array pattern) of an electrode material or a color material (pixel material) used for manufacturing of a liquid crystal display, an EL (electroluminescence) display, and a surface emission display may also be used. It is needless to say that the invention may also be applied to a printer other than the ink jet printer. For example, the invention may be applied to a dot impact printer, a thermal transfer printer, a laser printer, and the like. In addition, the invention may be applied to an electronic apparatus other than the printer. For example, the invention may also be applied to a scanner apparatus having a transport device.

The technical spirit understood from the embodiments and the modifications will be described below.

(1) In the pulse signal generating device described above, the pulse generating unit repeats making a pulse fall at a point of time when the time of a half period of the reasonable period or the measured period is measured from rising time of the previous pulse and making a pulse rise at a point of time when the time of the reasonable period or the measured period is measured from the rising time of the previous pulse.

(2) In the pulse signal generating device described above, the reasonable period is the average of a plurality of periods measured by the measurement unit.

What is claimed is:

1. A pulse signal generating device, comprising:
an encoder that outputs a pulse with a period corresponding to a speed of an object to be detected;
a measurement unit that measures the period of the pulse;
a storage unit that stores the measured period;
an operation unit that calculates a statistical period based on measured periods of a plurality of sequential pulses;
a detection unit that detects period abnormalities when the measured period measured by the measurement unit satisfies a period abnormality condition specified from the statistical period; and
a pulse generating unit that generates an output pulse on the basis of the measured period when the period abnormalities are not detected and generates the output pulse on the basis of the statistical period when the period abnormalities are detected.

2. The pulse signal generating device according to claim 1, wherein the detection unit includes a pulse missing detection unit that detects pulse missing as the period abnormalities when the measured period exceeds a pulse missing threshold value.

3. The pulse signal generating device according to claim 1, wherein the operation unit includes an abnormal period excluding unit that does not use the measured period detected as the period abnormalities for calculation of the statistical period.

4. The pulse signal generating device according to claim 1, wherein the operation unit calculates a current statistical period using a predetermined number (less than Q) of data, which includes three data items of a previous statistical period, a current measured period, and the number of data Q, and performs an operation using an operation expression equivalent to a statistical calculation expression for calculating the current statistical period on the basis of a measured period for Q pulses.

5. The pulse signal generating device according to claim 1, wherein the encoder includes a scale portion, which is provided along a movement direction of the object to be detected, and a plurality of sensors that detect different positions of the scale portion and output pulses each having a period corresponding to the speed, the detection unit is provided in a plural number corresponding to the sensors so that the period abnormalities are detected for each of the sensors, the pulse generating unit includes a switching unit that when period abnormalities are detected in a sensor that adopts a measured period, switches the sensor that adopts the measured period to another sensor in which the period abnormalities are not detected, and the pulse generating unit generates a pulse on the basis of the statistical period when the detection unit detects the period abnormalities in all of the plurality of sensors.

6. A transport device comprising:

the pulse signal generating device according to claim 1; and a transport unit as the object to be detected, wherein the encoder included in the pulse signal generating device outputs a pulse with a period corresponding to the transport speed of the transport unit.

7. An image forming apparatus comprising:

the transport device according to claim 6;

a recording unit that performs recording on a target transported by the transport unit to thereby form an image; and a recording pulse generating unit that generates a recording timing pulse of the recording unit on the basis of a pulse generated by the pulse generating unit.

8. A pulse signal generating method, comprising:

measuring a period of a pulse output from an encoder;

storing the measured period;

calculating a statistical period on the basis of a result of period measurements of a plurality of pulses;

detecting period abnormalities when the measured period in the measuring satisfies a period abnormality condition specified from the statistical period; and generating an output pulse on the basis of the measured period when the period abnormalities are not detected and generating the output pulse on the basis of the statistical period when the period abnormalities are detected.

* * * * *